(12) United States Patent
Park

(10) Patent No.: US 12,476,619 B2
(45) Date of Patent: Nov. 18, 2025

(54) SIGNAL DRIVER CIRCUIT, AND A SEMICONDUCTOR APPARATUS USING THE SAME

(71) Applicant: SK hynix Inc., Icheon-si (KR)

(72) Inventor: Hyun Su Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 35 days.

(21) Appl. No.: 18/429,768

(22) Filed: Feb. 1, 2024

(65) Prior Publication Data

US 2025/0088176 A1 Mar. 13, 2025

(30) Foreign Application Priority Data

Sep. 7, 2023 (KR) .................. 10-2023-0119146

(51) Int. Cl.
| | |
|---|---|
| *H03K 19/01* | (2006.01) |
| *H03K 3/011* | (2006.01) |
| *H03K 3/037* | (2006.01) |
| *H03K 19/20* | (2006.01) |
| *H03K 5/00* | (2006.01) |
| *H03K 5/01* | (2006.01) |

(52) U.S. Cl.
CPC ............ *H03K 3/011* (2013.01); *H03K 3/037* (2013.01); *H03K 19/20* (2013.01); *H03K 2005/00013* (2013.01); *H03K 5/01* (2013.01)

(58) Field of Classification Search
CPC .... H03K 3/01; H03K 17/687; H03K 17/6871; H03K 17/6872; H03K 17/6874; H03K 2005/00013; H03K 19/0175; H03K 19/0185; H03K 19/018507; H03K 19/018521; H03K 19/01855; H03K 19/20
See application file for complete search history.

(56) References Cited

U.S. PATENT DOCUMENTS

| | | | |
|---|---|---|---|
| 7,932,762 B2 | 4/2011 | Turner et al. | |
| 7,990,197 B2 * | 8/2011 | Lee | H03H 11/26 327/263 |
| 9,013,935 B2 | 4/2015 | Kim | |
| 2004/0145394 A1 * | 7/2004 | Nedachi | H03K 17/164 327/112 |

\* cited by examiner

*Primary Examiner* — Long Nguyen
(74) *Attorney, Agent, or Firm* — William Park & Associates Ltd.

(57) ABSTRACT

A signal driver circuit includes a pre-driving circuit, a driving signal generating circuit, a main driving circuit, and an output control circuit. The pre-driving circuit is configured to generate a first pre-driving signal and a second pre-driving signal based on an input signal and a clock signal. The driving signal generating circuit is configured to generate a pull-up driving signal and a pull-down driving signal based on the first pre-driving signal, the second pre-driving signal, and a complementary delayed output signal. The main driving circuit is configured to generate an output signal based on the pull-up driving signal and the pull-down driving signal. The complementary delayed output signal is generated by delaying the output signal. The output control circuit is configured to latch the output signal and configured to delay the output signal to generate a delayed output signal and the complementary delayed output signal.

20 Claims, 12 Drawing Sheets

SIGNAL DRIVER CIRCUIT, AND A SEMICONDUCTOR APPARATUS USING THE SAME

CROSS-REFERENCES TO RELATED APPLICATION

The present application claims priority under 35 U.S.C. § 119(a) to Korean application number 10-2023-0119146, filed on Sep. 7, 2023, in the Korean Intellectual Property Office, which is incorporated herein by reference in its entirety.

BACKGROUND

1. Technical Field

Various embodiments generally relate to integrated circuit technology, and more specifically, to a signal driver circuit and a semiconductor apparatus using the same.

2. Related Art

A semiconductor apparatus includes a plurality of internal circuits, and the plurality of internal circuits may transmit and receive signals to and from each other. A transmitting circuit and/or a driver circuit may be utilized to transmit signals from a first internal circuit to a second internal circuit. The first internal circuit may be connected to the second internal circuit via a signal transmission line, and the driver circuit may drive the signal transmission line to a high logic level or a low logic level based on the logic level of the signal to be transmitted from the first internal circuit to the second internal circuit.

Conventional transmitting circuits and/or driver circuits typically drive, according to an input signal, the signal transmission line to output signals in an enabled interval of a clock signal. However, as the semiconductor apparatus operates at a higher speed, it becomes challenging to set the enabled interval of the clock signal beyond a certain width to ensure a setup and hold margin. If the enabled interval of the clock signal is not sufficient, issues such as PVT (Process, Voltage, Temperature) variation can occur, and the significant load on the signal transmission line can lead to an insufficient swing range of the output signal.

SUMMARY

In an embodiment, a signal driver circuit may include a pre-driving circuit, a driving signal generating circuit, a main driving circuit, and an output control circuit. The pre-driving circuit may be configured to generate a first pre-driving signal and a second pre-driving signal based on an input signal and a clock signal. The driving signal generating circuit may be configured to generate a pull-up driving signal based on the first pre-driving signal and a complementary delayed output signal and configured to generate a pull-down driving signal based on the second pre-driving signal and the complementary delayed output signal. The main driving circuit may be configured to generate an output signal based on the pull-up driving signal and the pull-down driving signal. The output control circuit may be configured to latch the output signal and configured to delay the output signal to generate a delayed output signal and the complementary delayed output signal.

In an embodiment, a signal driver circuit may include a pre-driving circuit, a driving signal generating circuit, a main driving circuit, and an output control circuit. The pre-driving circuit may be configured to generate a first pre-driving signal and a second pre-driving signal based on an input signal, a clock signal, and a delayed output signal. The driving signal generating circuit may be configured to generate a pull-up driving signal based on the first pre-driving signal and a complementary delayed output signal and configured to generate a pull-down driving signal based on the second pre-driving signal and the complementary delayed output signal. The main driving circuit may be configured to generate an output signal based on the pull-up driving signal and the pull-down driving signal. The output control circuit may be configured to latch the output signal and configured to delay the output signal to generate the delayed output signal and the complementary delayed output signal.

In an embodiment, a semiconductor apparatus may include a first internal circuit and a second internal circuit. The first internal circuit may include a transmitting circuit configured to generate an output signal based on an input signal and configured to transmit the output signal through a signal transmission line to the second internal circuit. The second internal circuit may be configured to receive the output signal.

The transmitting circuit may include a pre-driving circuit, a driving signal generating circuit, a main driving circuit, and an output control circuit. The pre-driving circuit may be configured to generate a first pre-driving signal and a second pre-driving signal based on the input signal and a clock signal. The driving signal generating circuit may be configured to generate a pull-up driving signal based on the first pre-driving signal and a complementary delayed output signal and configured to generate a pull-down driving signal based on the second pre-driving signal and the complementary delayed output signal. The main driving circuit may be configured to generate the output signal based on the pull-up driving signal and the pull-down driving signal. The output control circuit may be configured to latch the output signal and configured to delay the output signal to generate a delayed output signal and the complementary delayed output signal.

In an embodiment, a semiconductor apparatus may include a first internal circuit and a second internal circuit. The first internal circuit may include a transmitting circuit configured to generate an output signal based on an input signal and configured to transmit the output signal through a signal transmission line to the second internal circuit. The second internal circuit may be configured to receive the output signal.

The transmitting circuit may include a pre-driving circuit, a driving signal generating circuit, a main driving circuit, and an output control circuit. The pre-driving circuit may be configured to generate a first pre-driving signal and a second pre-driving signal based on the input signal, a clock signal, and a delayed output signal. The driving signal generating circuit may be configured to generate a pull-up driving signal based on the first pre-driving signal and a complementary delayed output signal and configured to generate a pull-down driving signal based on the second pre-driving signal and the complementary delayed output signal. The main driving circuit may be configured to pull-down drive the output signal based on the pull-up driving signal and the pull-down driving signal. The output control circuit may be configured to latch the output signal and configured to delay the output signal to generate the delayed output signal and the complementary delayed output signal.

DETAILED DESCRIPTION

Figure 1:
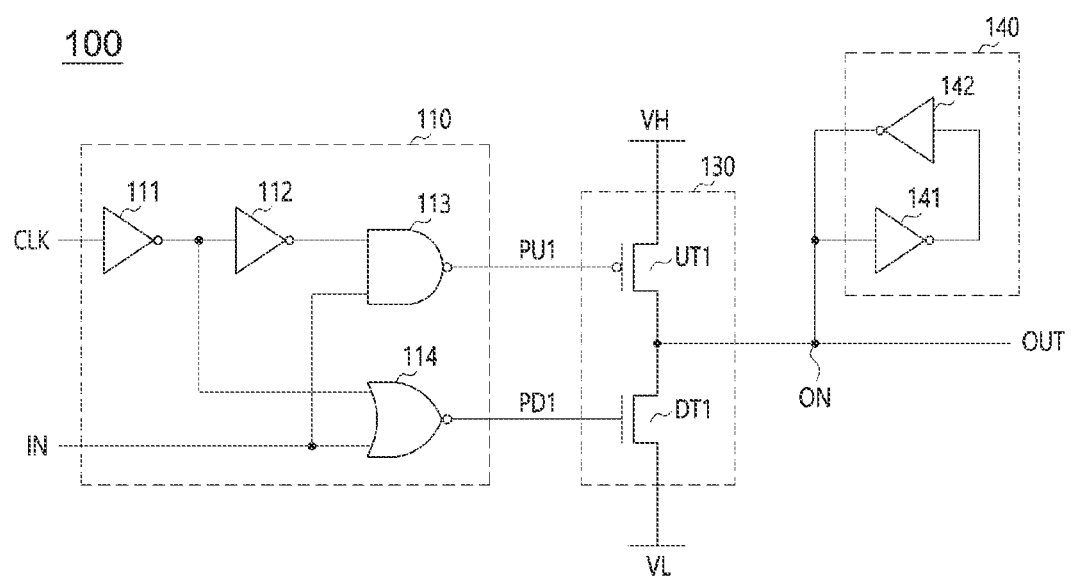
FIG. 1 is a diagram illustrating a configuration of a signal driver circuit in accordance with an embodiment.

FIG. 1 is a diagram illustrating a configuration of a signal driver circuit 100 in accordance with an embodiment. Referring to FIG. 1, the signal driver circuit 100 may receive an input signal IN and a clock signal CLK to generate an output signal OUT. The input signal IN may be a digital information signal having a high logic level and a low logic level. The logic level of the input signal IN may vary arbitrarily or in accordance with information carried by the signal. The clock signal CLK may have a pulse that is enabled, according to the change in the logic level of the input signal IN, at a regular interval to alter the logic level of the output signal OUT. In an embodiment, the enabled interval of the clock signal CLK may be shorter than the disabled interval thereof. The signal driver circuit 100 may detect, during the enabled interval of the clock signal CLK, the logic level of the input signal IN to pull-up and pull-down drive the output signal OUT thereby changing the logic level of the output signal OUT.

The signal driver circuit 100 may include a pre-driving circuit 110, a main driving circuit 130, and an output latch 140. The pre-driving circuit 110 may receive the input signal IN and the clock signal CLK. When the clock signal CLK is enabled, the pre-driving circuit 110 may generate a pull-up driving signal PU1 and a pull-down driving signal PD1 according to the logic level of the input signal IN. Depending on the logic level of the input signal IN, the pre-driving circuit 110 may enable either the pull-up driving signal PU1 or the pull-down driving signal PD1. For example, when the input signal IN is at a high logic level, the pre-driving circuit 110 may enable the pull-up driving signal PU1 and disable the pull-down driving signal PD1. Conversely, when the input signal IN is at a low logic level, the pre-driving circuit 110 may disable the pull-up driving signal PU1 and enable the pull-down driving signal PD1. When the clock signal CLK is disabled, the pre-driving circuit 110 may disable both the pull-up driving signal PU1 and the pull-down driving signal PD1 regardless of the logic level of the input signal IN.

The main driving circuit 130 may receive the pull-up driving signal PU1 and the pull-down driving signal PD1 from the pre-driving circuit 110. The main driving circuit 130 may pull-up drive the output signal OUT based on the pull-up driving signal PU1 and may pull-down drive the output signal OUT based on the pull-down driving signal PD1. The main driving circuit 130 may receive a first power voltage VH and a second power voltage VL. The first power voltage VH may have a voltage level higher than the second power voltage VL. The first power voltage VH may have a sufficiently high voltage level to be regarded as a high logic level and the second power voltage VL may have a sufficiently low voltage level to be regarded as a low logic level. When the pull-up driving signal PU1 is enabled, the main driving circuit 130 may pull-up drive the output signal OUT to the voltage level of the first power voltage VH. Similarly, when the pull-down driving signal PD1 is enabled, the main driving circuit 130 may pull-down drive the output signal OUT to the voltage level of the second power voltage VL.

The output latch 140 may receive the output signal OUT and may maintain the logic level and/or the voltage level of the output signal OUT. The current drivability of the output latch 140 may be weaker than the current drivability of the main driving circuit 130. For instance, when the main driving circuit 130 drives the logic level of the output signal OUT to the opposite logic level, the latch value of the output latch 140 may be inverted and the output latch 140 may latch the changed logic level of the output signal OUT caused by the main driving circuit 130. When the output signal OUT is not driven by the main driving circuit 130, the output latch 140 may have a sufficient current drivability to maintain the logic level and/or the voltage level of the output signal OUT.

The pre-driving circuit 110 may include a first inverter 111, a second inverter 112, a NAND gate 113, and a NOR gate 114. The first inverter 111 may invert the clock signal CLK. The second inverter 112 may invert an output signal of the first inverter 111. The NAND gate 113 may receive the output signal of the second inverter 112 and the input signal IN to generate the pull-up driving signal PU1. The NOR gate 114 may receive an output signal of the first inverter 111 and the input signal IN to generate the pull-down driving signal PD1. When the clock signal CLK is enabled or when there occurs the rising edge of the clock signal CLK, the output signal of the first inverter 111 may be at a low logic level and the output signal of the second inverter 112 may be at a high logic level. When the input signal IN is at a high logic level, the NAND gate 113 may enable the pull-up driving signal PU1 to a low logic level based on the output signal of the second inverter 112 and the input signal IN. When the input signal IN is at a low logic level, the NOR gate 114 may enable the pull-down driving signal PD1 to a high logic level based on the output signal of the first inverter 111 and the input signal IN. When the clock signal CLK is disabled or when there occurs the falling edge of the clock signal CLK, the output signal of the first inverter 111 may be at a high logic level and the output signal of the second inverter 112 may be at a low logic level. Therefore, the NAND gate 113 may disable the pull-up driving signal PU1 to a high logic level regardless of the logic level of the input signal IN and the NOR gate 114 may disable the pull-down driving signal PD1 to a low logic level regardless of the logic level of the input signal IN.

The main driving circuit 130 may include a pull-up transistor UT1 and a pull-down transistor DT1. The pull-up transistor UT1 may receive the pull-up driving signal PU1 and may pull-up drive the output node ON based on the pull-up driving signal PU1. The output signal OUT may be output from the output node ON. The pull-down transistor DT1 may receive the pull-down driving signal PD1 and may pull-down drive the output node ON based on the pull-down driving signal PD1. The pull-up transistor UT1 may be a P-channel MOS transistor and the pull-down transistor DT1 may be a N-channel MOS transistor. The gate of the pull-up transistor UT1 may receive the pull-up driving signal PU1, the source of the pull-up transistor UT1 may receive the first power voltage VH, and the drain of the pull-up transistor UT1 may be connected to the output node ON. The gate of the pull-down transistor DT1 may receive the pull-down driving signal PD1, the drain of the pull-down transistor DT1 may be connected to the output node ON, and the source of the pull-down transistor DT1 may receive the second power voltage VL. When the pull-up driving signal PU1 is enabled to a low logic level, the pull-up transistor UT1 may provide the output node ON with current from a node to which the first power voltage VH is supplied to drive the output signal OUT to a high logic level. When the pull-down driving signal PD1 is enabled to a high logic level, the pull-down transistor DT1 may discharge current from the output node ON to a node to which the second power voltage VL is supplied to drive the output signal OUT to a low logic level.

The output latch 140 may include a first inverter 141 and a second inverter 142. The input node of the first inverter 141 may be connected to the output node ON and may receive the output signal OUT. The input node of the second inverter 142 may be connected to the output node of the first inverter 141 and the output node of the second inverter 142 may be connected to the output node ON.

Figure 2:
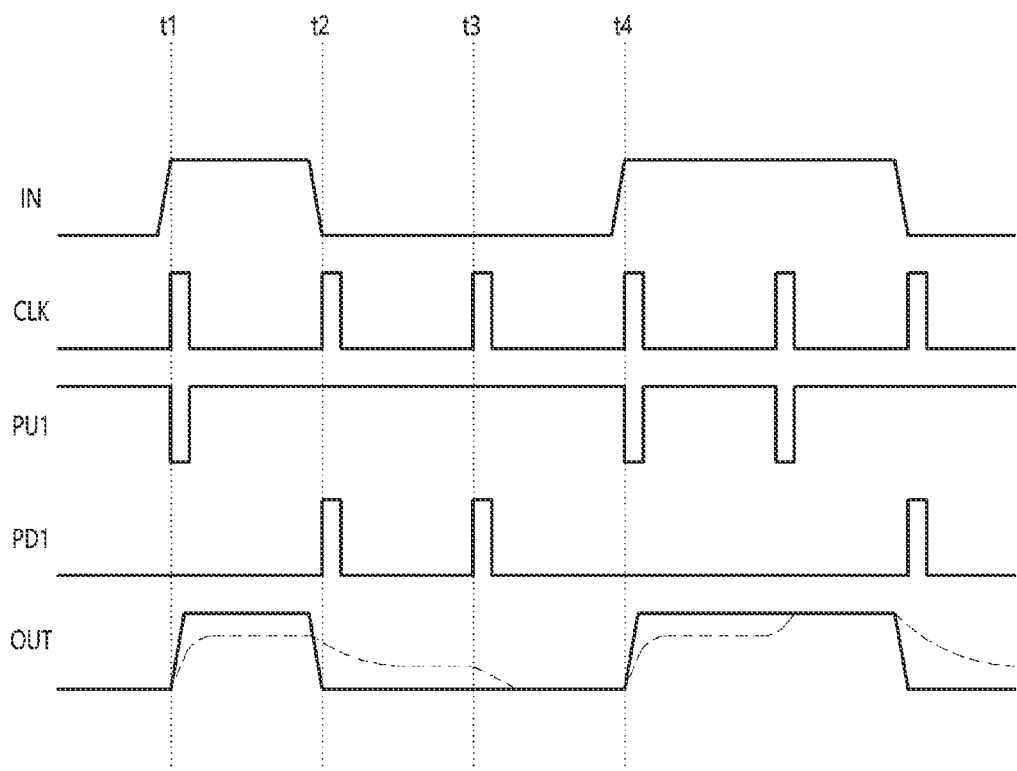
FIG. 2 is a timing diagram illustrating an operation of a signal driver circuit in accordance with an embodiment.

FIG. 2 is a timing diagram illustrating an operation of the signal driver circuit 100 in accordance with an embodiment. Hereinafter, described with reference to FIGS. 1 and 2 is the operation of the signal driver circuit 100 in accordance with an embodiment. The clock signal CLK may be enabled at a regular interval. At t1 when the clock signal CLK is enabled and the logic level of the input signal IN is a high logic level, the pre-driving circuit 110 may enable the pull-up driving signal PU1 to a low logic level and may keep the pull-down driving signal PD1 disabled. The main driving circuit 130 may change, based on the pull-up driving signal PU1, the logic level of the output signal OUT to a high logic level. When the clock signal CLK is disabled, the pre-driving circuit 110 may disable the pull-up driving signal PU1. At t2 when the clock signal CLK is enabled and the logic level of the input signal IN changes from a high logic level to a low logic level, the pre-driving circuit 110 may keep the pull-up driving signal PU1 disabled and may enable the pull-down driving signal PD1 to a high logic level. The main driving circuit 130 may change, based on the pull-down driving signal PD1, the logic level of the output signal OUT to a low logic level. When the clock signal CLK is disabled, the pre-driving circuit 110 may disable the pull-down driving signal PD1. At t3 when the clock signal CLK is enabled and the logic level of the input signal IN stays as a low logic level, the pre-driving circuit 110 may keep the pull-up driving signal PU1 disabled and may enable the pull-down driving signal PD1 to a high logic level. The main driving circuit 130 may drive the output signal OUT to a low logic level based on the pull-down driving signal PD1 and the logic level of the output signal OUT may stay unchanged. When the clock signal CLK is disabled, the pre-driving circuit 110 may disable the pull-down driving signal PD1. At t4 when the clock signal CLK is enabled and the logic level of the input signal IN changes from a low logic level to a high logic level, the pre-driving circuit 110 may enable the pull-up driving signal PU1 to a low logic level and may keep the pull-down driving signal PD1 disabled. The main driving circuit 130 may change the logic level of the output signal OUT to a high logic level based on the pull-up driving signal PU1. When the clock signal CLK is disabled, the pre-driving circuit 110 may disable the pull-up driving signal PU1.

The signal driver circuit 100 may enable the pull-up driving signal PU1 and the pull-down driving signal PD1 only during the enabled interval of the clock signal CLK. Therefore, when the interval is short during which the pull-up driving signal PU1 and the pull-down driving signal PD1 are enabled, it may be challenging to fully drive the output signal OUT, and the output signal OUT might not achieve a full swing between the first power voltage VH and the second power voltage VL. Particularly, when the output signal OUT is transmitted through a signal transmission line having a large load, the swing range of the output signal OUT may decrease further. Accordingly, as shown by the dashed line in FIG. 2, during the intervals respectively between the time points t1 and t2, between the time points t2 and t3 and after the time point t4, the output signal OUT might not achieve a full swing and may have a reduced swing range. When the output signal OUT does not achieve a full swing, the reduced swing range may decrease the setup and hold margin of other circuits configured to receive the output signal OUT, which makes accurate communication difficult. To increase the swing range of the output signal OUT, disclosed are increasing the pulse width of the clock signal CLK and increasing the size and/or current drivability of a transistor within the main driving circuit 130. However, the pulse width of the clock signal CLK can be increased within a limited range when considering the setup and hold margin for detecting the logic level of the input signal IN and the PVT variation. Additionally, the increasing of the current drivability of the main driving circuit 130 may lead to increased power consumption.

Figure 3:
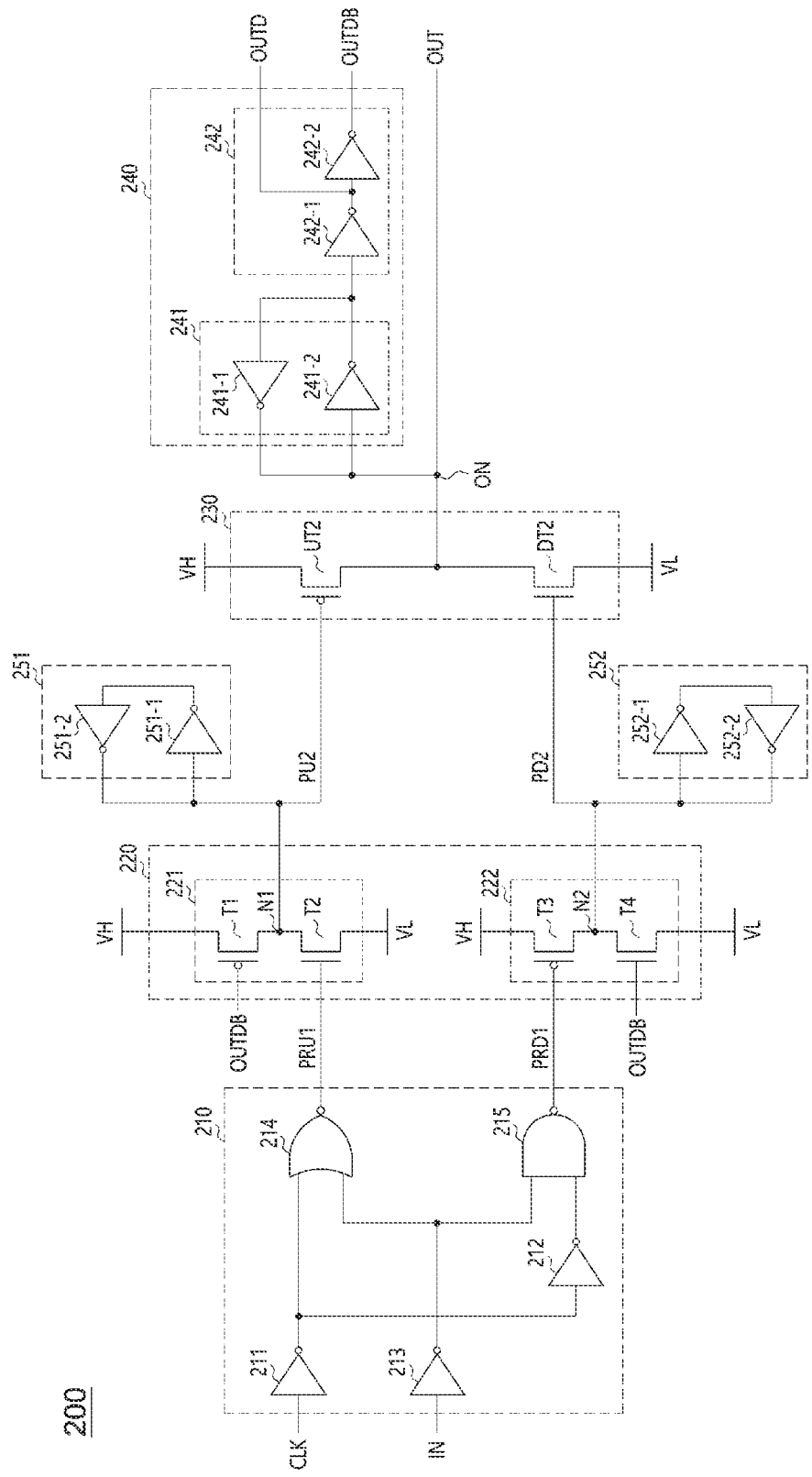
FIG. 3 is a diagram illustrating a configuration of a signal driver circuit in accordance with an embodiment.

FIG. 3 is a diagram illustrating a configuration of a signal driver circuit 200 in accordance with an embodiment. Referring to FIG. 3, the signal driver circuit 200 may receive an input signal IN and a clock signal CLK to generate an output signal OUT. The input signal IN may be a digital information signal having a high logic level and a low logic level. The logic level of the input signal IN may vary arbitrarily or according to information carried by the signal. The clock signal CLK may have a pulse that is enabled, according to the change in the logic level of the input signal IN, at a regular interval to alter the logic level of the output signal OUT. In an embodiment, the enabled interval of the clock signal CLK may be shorter than the disabled interval thereof. The signal driver circuit 200 may detect, during the enabled interval of the clock signal CLK, the logic level of the input signal IN to pull-up and pull-down drive the output signal OUT thereby changing the logic level of the output signal OUT. The signal driver circuit 200 may receive, as feedback, the output signal OUT and may adjust, based on the output signal OUT, the duration during which the output signal OUT is driven. The signal driver circuit 200 may also disable, based on the output signal OUT, a pull-up driving signal PU2 and a pull-down driving signal PD2, which are respectively utilized to pull-up and pull-down drive the output signal OUT.

The signal driver circuit 200 may include a pre-driving circuit 210, a driving signal generating circuit 220, a main driving circuit 230, and an output control circuit 240. The pre-driving circuit 210 may receive the input signal IN and the clock signal CLK to generate a first pre-driving signal PRU1 and a second pre-driving signal PRD1 based on the input signal IN and the clock signal CLK. The pre-driving circuit 210 may detect the logic level of the input signal IN when the clock signal CLK is enabled. The pre-driving circuit 210 may generate, according to the logic level of the input signal IN, the first pre-driving signal PRU1 and the second pre-driving signal PRD1 when the clock signal CLK is enabled and/or when there occurs the rising edge of the clock signal CLK. The pre-driving circuit 210 may enable either the first pre-driving signal PRU1 or the second pre-driving signal PRD1 according to the logic level of the input signal IN. For example, when the input signal IN is at a high logic level, the pre-driving circuit 210 may enable the first pre-driving signal PRU1 and may disable the second pre-driving signal PRD1. When the input signal IN is at a low logic level, the pre-driving circuit 210 may disable the first pre-driving signal PRU1 and may enable the second pre-driving signal PRD1. The pre-driving circuit 210 may disable, regardless of the logic level of the input signal IN, both the first pre-driving signal PRU1 and the second pre-driving signal PRD1 when the clock signal CLK is disabled and/or when there occurs the falling edge of the clock signal CLK.

The driving signal generating circuit 220 may receive the first pre-driving signal PRU1 and the second pre-driving signal PRD1 from the pre-driving circuit 210. Based on the first pre-driving signal PRU1, the second pre-driving signal PRD1, and the output signal OUT, the driving signal generating circuit 220 may generate the pull-up driving signal PU2 and the pull-down driving signal PD2. The driving signal generating circuit 220 may also receive, as feedback, a complementary delayed output signal OUTDB. The complementary delayed output signal OUTDB may be provided from the output control circuit 240, which is described later. The complementary delayed output signal OUTDB may have an opposite logic level to the output signal OUT. Based on the first pre-driving signal PRU1 and the complementary delayed output signal OUTDB, the driving signal generating circuit 220 may generate the pull-up driving signal PU2. The driving signal generating circuit 220 may enable the pull-up driving signal PU2 based on the first pre-driving signal PRU1 and may disable the pull-up driving signal PU2 according to the complementary delayed output signal OUTDB. Based on the second pre-driving signal PRD1 and the complementary delayed output signal OUTDB, the driving signal generating circuit 220 may generate the pull-down driving signal PD2. The driving signal generating circuit 220 may enable the pull-down driving signal PD2 based on the second pre-driving signal PRD1 and may disable the pull-down driving signal PD2 based on the complementary delayed output signal OUTDB. The driving signal generating circuit 220 may enable the pull-up driving signal PU2 and the pull-down driving signal PD2 based on the clock signal CLK and may disable the pull-up driving signal PU2 and the pull-down driving signal PD2 based on the complementary delayed output signal OUTDB. Therefore, the respective pulse widths and/or respectively enabled intervals of the pull-up driving signal PU2 and the pull-down driving signal PD2 may vary depending on the timing of the generation of the complementary delayed output signal OUTDB.

The main driving circuit 230 may receive the pull-up driving signal PU2 and the pull-down driving signal PD2 from the driving signal generating circuit 220. The main driving circuit 230 may pull-up drive the output signal OUT based on the pull-up driving signal PU2 and may pull-down drive the output signal OUT based on the pull-down driving signal PD2. The main driving circuit 230 may also receive a first power voltage VH and a second power voltage VL. The first power voltage VH may have a voltage level higher than the second power voltage VL. The first power voltage VH may have a sufficiently high voltage level to be regarded as a high logic level and the second power voltage VL may have a sufficiently low voltage level to be regarded as a low logic level. When the pull-up driving signal PU2 is enabled, the main driving circuit 230 may pull-up drive the output signal OUT to the voltage level of the first power voltage VH. When the pull-down driving signal PD2 is enabled, the main driving circuit 230 may pull-down drive the output signal OUT to the voltage level of the second power voltage VL.

The output control circuit 240 may receive the output signal OUT and may maintain the logic level and/or the voltage level of the output signal OUT. The current drivability of the output control circuit 240 may be weaker than the main driving circuit 230. For instance, when the main driving circuit 230 drives the output signal OUT to the opposite logic level, the latch value of the output control circuit 240 may be inverted and the output control circuit 240 may latch the changed logic level of the output signal OUT caused by the main driving circuit 230. When the output signal OUT is not driven by the main driving circuit 230, the output control circuit 240 may have a sufficient current drivability to maintain the logic level and/or the voltage level of the output signal OUT. The output control circuit 240 may sequentially delay the output signal OUT to generate a delayed output signal OUTD and a complementary delayed output signal OUTDB. The delayed output signal OUTD may have the same logic level as the output signal OUT while the complementary delayed output signal OUTDB may have the opposite logic level to the output signal OUT. The delay time, by which the output control circuit 240 delays the output signal OUT, may vary thereby appropriately adjusting the respective pulse widths of the pull-up driving signal PU2 and the pull-down driving signal PD2.

The signal driver circuit 200 may further include a first latch 251 and a second latch 252. The first latch 251 may receive the pull-up driving signal PU2 and may maintain the logic level and/or the voltage level of the pull-up driving signal PU2. The second latch 252 may receive the pull-down driving signal PD2 and may maintain the logic level and/or the voltage level of the pull-down driving signal PD2. The current drivability of each of the first latch 251 and the second latch 252 may be weaker than the current drivability of the driving signal generating circuit 220. When the driving signal generating circuit 220 drives the pull-up driving signal PU2 and the pull-down driving signal PD2 to opposite logic levels, the respective latch values of the first latch 251 and the second latch 252 may change. The first latch 251 and the second latch 252 may latch the changed logic levels of the pull-up driving signal PU2 and the pull-down driving signal PD2 respectively caused by the driving signal generating circuit 220.

The pre-driving circuit 210 may include a first inverter 211, a second inverter 212, a third inverter 213, a NOR gate 214, and a NAND gate 215. The first inverter 211 may invert the clock signal CLK. The second inverter 212 may invert the output signal of the first inverter 211. The third inverter 213 may invert the input signal IN. The NOR gate 214 may receive the output signal of the first inverter 211 and the output signal of the third inverter 213 to generate the first pre-driving signal PRU1. The NAND gate 215 may receive the output signal of the second inverter 212 and the output signal of the third inverter 213 to generate the second pre-driving signal PRD1. When the clock signal CLK is enabled, the output signal of the first inverter 211 may be at a low logic level and the output signal of the second inverter 212 may be at a high logic level. When the input signal IN is at a high logic level, the output signal of the third inverter 213 may be at a low logic level and the NOR gate 214 may enable the first pre-driving signal PRU1 to a high logic level while the NAND gate 215 may disable the second pre-driving signal PRD1 to a high logic level. When the input signal IN is at a low logic level, the output signal of the third inverter 213 may be at a high logic level and the NOR gate 214 may disable the first pre-driving signal PRU1 to a low logic level while the NAND gate 215 may enable the second pre-driving signal PRD1 to a low logic level.

The driving signal generating circuit 220 may include a pull-up driving signal generating circuit 221 and a pull-down driving signal generating circuit 222. The pull-up driving signal generating circuit 221 may receive the first pre-driving signal PRU1 and the complementary delayed output signal OUTDB to generate the pull-up driving signal PU2 based on the first pre-driving signal PRU1 and the complementary delayed output signal OUTDB. The pull-up driving signal generating circuit 221 may enable the pull-up driving signal PU2 based on the first pre-driving signal PRU1 and may disable the pull-up driving signal PU2 based on according to the complementary delayed output signal OUTDB. The pull-up driving signal generating circuit 221 may enable the pull-up driving signal PU2 when the first pre-driving signal PRU1 is enabled and may disable the pull-up driving signal PU2 when the logic level of the complementary delayed output signal OUTDB changes.

The pull-down driving signal generating circuit 222 may receive the second pre-driving signal PRD1 and the complementary delayed output signal OUTDB to generate the pull-down driving signal PD2 based on the second pre-driving signal PRD1 and the complementary delayed output signal OUTDB. The pull-down driving signal generating circuit 222 may enable the pull-down driving signal PD2 based on the second pre-driving signal PRD1 and may disable the pull-down driving signal PD2 based on the complementary delayed output signal OUTDB. The pull-down driving signal generating circuit 222 may enable the pull-down driving signal PD2 when the second pre-driving signal PRD1 is enabled and may disable the pull-down driving signal PD2 when the logic level of the complementary delayed output signal OUTDB changes.

The pull-up driving signal generating circuit 221 may include a first transistor T1 and a second transistor T2. The first transistor T1 may be a P-channel MOS transistor and the second transistor T2 may be a N-channel MOS transistor. The gate of the first transistor T1 may receive the complementary delayed output signal OUTDB, the source of the first transistor T1 may receive the first power voltage VH and the drain of the first transistor T1 may be connected to the first node N1. The pull-up driving signal PU2 may be generated through the first node N1. The gate of the second transistor T2 may receive the first pre-driving signal PRU1, the drain of the second transistor T2 may be connected to the first node N1 and the source of the second transistor T2 may receive the second power voltage VL. When the first pre-driving signal PRU1 is enabled to a high logic level, the second transistor T2 may drive the first node N1 through the second power voltage VL thereby enabling the pull-up driving signal PU2 to a low logic level. When the logic level of the complementary delayed output signal OUTDB changes from a high logic level to a low logic level, the first transistor T1 may drive the first node N1 through the first power voltage VH thereby disabling the pull-up driving signal PU2 to a high logic level.

The pull-down driving signal generating circuit 222 may include a third transistor T3 and a fourth transistor T4. The third transistor T3 may be a P-channel MOS transistor and the fourth transistor T4 may be an N-channel MOS transistor. The gate of the third transistor T3 may receive the second pre-driving signal PRD1, the source of the third transistor T3 may receive the first power voltage VH and the drain of the third transistor T3 may be connected to the second node N2. The pull-down driving signal PD2 may be generated through the second node N2. The gate of the fourth transistor T4 may receive the complementary delayed output signal OUTDB, the drain of the fourth transistor T4 may be connected to the second node N2 and the source of the fourth transistor T4 may receive the second power voltage VL. When the second pre-driving signal PRD1 is enabled to a low logic level, the third transistor T3 may drive the second node N2 through the first power voltage VH thereby enabling the pull-down driving signal PD2 to a high logic level. When the logic level of the complementary delayed output signal OUTDB changes from a low logic level to a high logic level, the fourth transistor T4 may drive the second node N2 through the second power voltage VL thereby disabling the pull-down driving signal PD2 to a low logic level.

The main driving circuit 230 may include a pull-up transistor UT2 and a pull-down transistor DT2. The pull-up transistor UT2 may receive the pull-up driving signal PU2 and may pull-up drive the output node ON based on the pull-up driving signal PU2. The output signal OUT may be output from the output node ON. The pull-down transistor DT2 may receive the pull-down driving signal PD2 and may pull-down drive the output node ON based on the pull-down driving signal PD2. The pull-up transistor UT2 may be a P-channel MOS transistor and the pull-down transistor DT2 may be a N-channel MOS transistor. The gate of the pull-up transistor UT2 may receive the pull-up driving signal PU2, the source of the pull-up transistor UT2 may receive the first power voltage VH, and the drain of the pull-up transistor UT2 may be connected to the output node ON. The gate of the pull-down transistor DT2 may receive the pull-down driving signal PD2, the drain of the pull-down transistor DT2 may be connected to the output node ON, and the source of the pull-down transistor DT2 may receive the second power voltage VL. When the pull-up driving signal PU2 is enabled to a low logic level, the pull-up transistor UT2 may provide the output node ON with current from a node, to which the first power voltage VH is supplied, to drive the output signal OUT to a high logic level. When the pull-down driving signal PD2 is enabled to a high logic level, the pull-down transistor DT2 may discharge current from the output node ON to a node, to which the second power voltage VL is suppled, to drive the output signal OUT to a low logic level.

The output control circuit 240 may include a cross-coupled inverter 241 and a delay circuit 242. The cross-coupled inverter 241 may receive the output signal OUT and may maintain the logic level and/or the voltage level of the output signal OUT. The delay circuit 242 may receive the output signal of the cross-coupled inverter 241. The delay circuit 242 may sequentially delay the output signal of the cross-coupled inverter 241 to generate the delayed output signal OUTD and the complementary delayed output signal OUTDB. The cross-coupled inverter 241 may include a first inverter 241-1 and a second inverter 241-2. The input node of the first inverter 241-1 may receive the output signal OUT. The output node of the first inverter 241-1 may be connected to the input node of the second inverter 241-2 and the input node of the delay circuit 242. The output node of the second inverter 241-2 may be connected to the input node of the first inverter 241-1. The delay circuit 242 may include a third inverter 242-1 and a fourth inverter 242-2. The input node of the third inverter 242-1 may be connected to the output node of the first inverter 241-1 to receive the output signal of the cross-coupled inverter 241. The third inverter 242-1 may invert and delay the output signal of the cross-coupled inverter 241 to generate the delayed output signal OUTD. The fourth inverter 242-2 may receive the delayed output signal OUTD from the third inverter 242-1 and may invert and delay the delayed output signal OUTD to generate the complementary delayed output signal OUTDB. The current drivability of each of the third inverter 242-1 and the fourth inverter 242-2 may vary to adjust the delay time for generating, from the output signal OUT, the delayed output signal OUTD and the complementary delayed output signal OUTDB. The delay circuit 242 may further include various numbers of additional inverters to adjust the delay time for generating, from the output signal OUT, the delayed output signal OUTD and the complementary delayed output signal OUTDB.

The first latch 251 may include a first inverter 251-1 and a second inverter 251-2. The input node of the first inverter 251-1 may be connected to the first node N1 to receive the pull-up driving signal PU2. The input node of the second inverter 251-2 may be connected to the output node of the first inverter 251-1. The output node of the second inverter 251-2 may be connected to the input node of the first inverter 251-1 and the first node N1. The second latch 252 may include a third inverter 252-1 and a fourth inverter 252-2. The input node of the third inverter 252-1 may be connected to the second node N2 to receive the pull-down driving signal PD2. The input node of the fourth inverter 252-2 may be connected to the output node of the third inverter 252-1. The output node of the fourth inverter 252-2 may be connected to the input node of the third inverter 252-1 and the second node N2.

Figure 4:
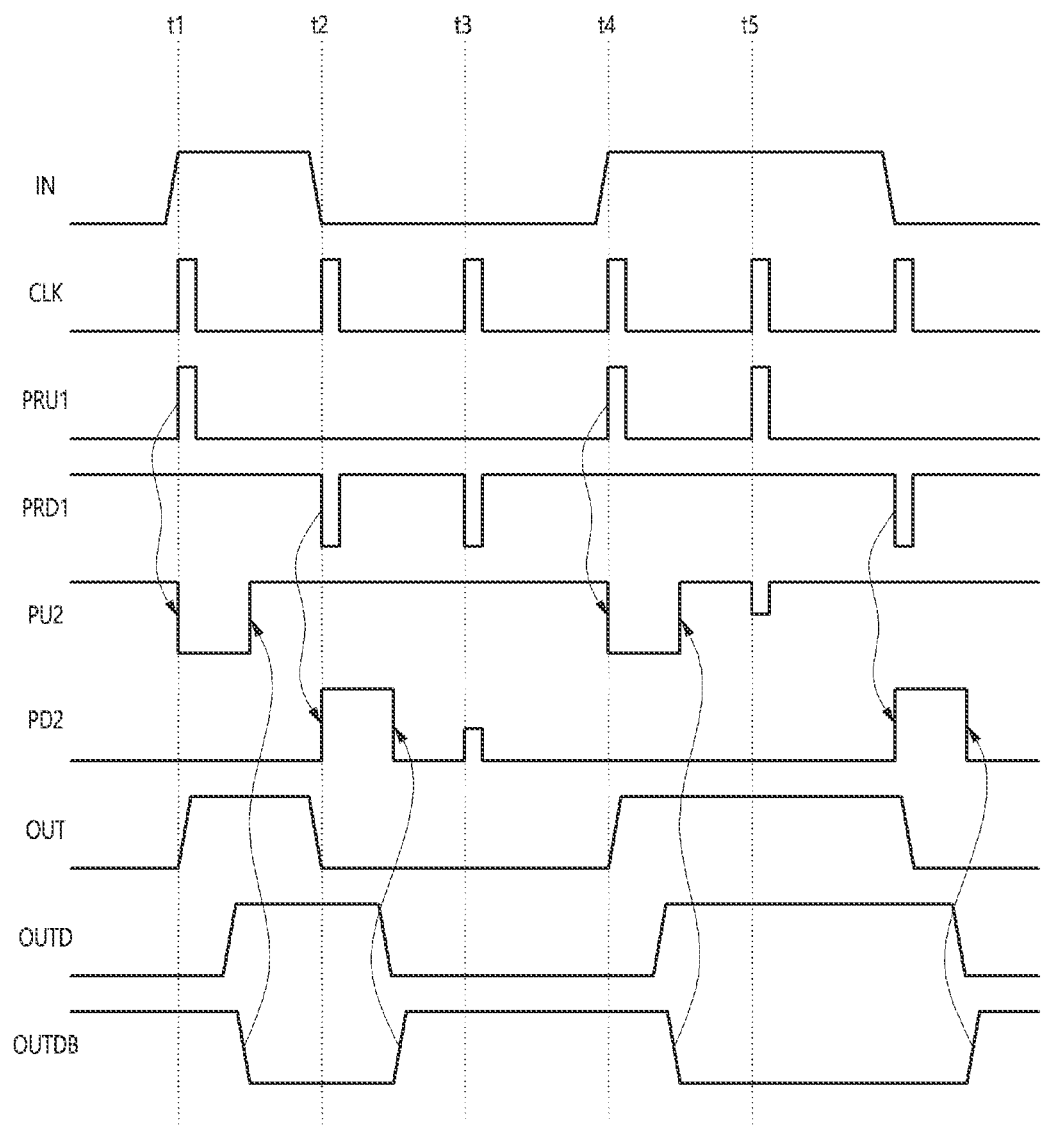
FIG. 4 is a timing diagram illustrating an operation of a signal driver circuit in accordance with an embodiment.

FIG. 4 is a timing diagram illustrating an operation of the signal driver circuit 200 in accordance with an embodiment. Hereinafter, described with reference to FIGS. 3 and 4 is the operation of the signal driver circuit 200 in accordance with an embodiment. At t1 when the clock signal CLK is enabled and the input signal IN is at a high logic level, the pre-driving circuit 210 may enable the first pre-driving signal PRU1 to a high logic level and may disable the second pre-driving signal PRD1 to a high logic level. The driving signal generating circuit 220 may enable the pull-up driving signal PU2 to a low logic level and the main driving circuit 230 may change the logic level of the output signal OUT to a high logic level based on the pull-up driving signal PU2. Even when the clock signal CLK is disabled, the pull-up driving signal PU2 may stay at a low logic level. The output control circuit 240 may latch the output signal OUT and may delay the output signal OUT to generate the complementary delayed output signal OUTDB. When the logic level of the complementary delayed output signal OUTDB changes from a high logic level to a low logic level, the driving signal generating circuit 220 may disable the pull-up driving signal PU2 to a high logic level. At t2 when the clock signal CLK is enabled and the input signal IN is at a low logic level, the pre-driving circuit 210 may disable the first pre-driving signal PRU1 to a low logic level and may enable the second pre-driving signal PRD1 to a low logic level. The driving signal generating circuit 220 may enable the pull-down driving signal PD2 to a high logic level and the main driving circuit 230 may change the logic level of the output signal OUT to a low logic level based on the pull-down driving signal PD2. Even when the clock signal CLK is disabled, the pull-down driving signal PD2 may stay at a high logic level. The output control circuit 240 may latch the output signal OUT and may delay the output signal OUT to generate the complementary delayed output signal OUTDB. When the logic level of the complementary delayed output signal OUTDB changes from a low logic level to a high logic level, the driving signal generating circuit 220 may disable the pull-down driving signal PD2 to a low logic level. The driving signal generating circuit 220 may keep the pull-up driving signal PU2 and the pull-down driving signal PD2 enabled until the complementary delayed output signal OUTDB is fed back, which ensures that the output signal OUT driven by the main driving circuit 230 may fully swing. At t3 when the clock signal CLK is enabled and the input signal IN stays at a low logic level, the pre-driving circuit 210 may enable the second pre-driving signal PRD1. At this time, because the complementary delayed output signal OUTDB is at a high logic level, leakage current in the pull-down driving signal generating circuit 222 may occur from the node, to which the first power voltage VH is supplied, to the node, to which the second power voltage VL is supplied, which may result in the generation of the pull-down driving signal PD2 having a lower voltage level than the pull-down driving signal PD2 generated at the time point t2. Although the main driving circuit 230 may respond to the pull-down driving signal PD2, the logic level of the output signal OUT might not change because the output signal OUT stays at a low logic level. At t4 when the clock signal CLK is enabled and the logic level of the input signal IN changes from a low logic level to a high logic level, the pre-driving circuit 210 may enable the first pre-driving signal PRU1 and the driving signal generating circuit 220 may enable the pull-up driving signal PU2. The main driving circuit 230 may change the logic level of the output signal OUT to a high logic level based on the pull-up driving signal PU2. After the logic level of the output signal OUT has changed to a high logic level, the logic level of the complementary delayed output signal OUTDB may change to a low logic level. When the logic level of the complementary delayed output signal OUTDB changes from a high logic level to a low logic level, the driving signal generating circuit 220 may disable the pull-up driving signal PU2 to a low logic level. At t5 when the clock signal CLK is enabled and the input signal IN stays at a high logic level, the pre-driving circuit 210 may enable the first pre-driving signal PRU1. At this time, because the complementary delayed output signal OUTDB is at a low logic level, leakage current in the pull-up driving signal generating circuit 221 may occur from the node, to which the first power voltage VH is supplied, to the node, to which the second power voltage VL is supplied, which may result in the generation of the pull-up driving signal PU2 having a higher voltage level than the pull-up driving signal PU2 generated at the time point t4. Although the main driving circuit 230 may respond to the pull-up driving signal PU2, the logic level of the output signal OUT might not change because the output signal OUT stays at a high logic level. When the logic level of the input signal IN is maintained at t3 and t5 and the first pre-driving signal PRU1 and the second pre-driving signal PRD1 are repeatedly enabled by the pre-driving circuit 210 or there occurs the leakage current in the driving signal generating circuit 220, unnecessary power consumption may increase in the signal driver circuit 200.

Figure 5:
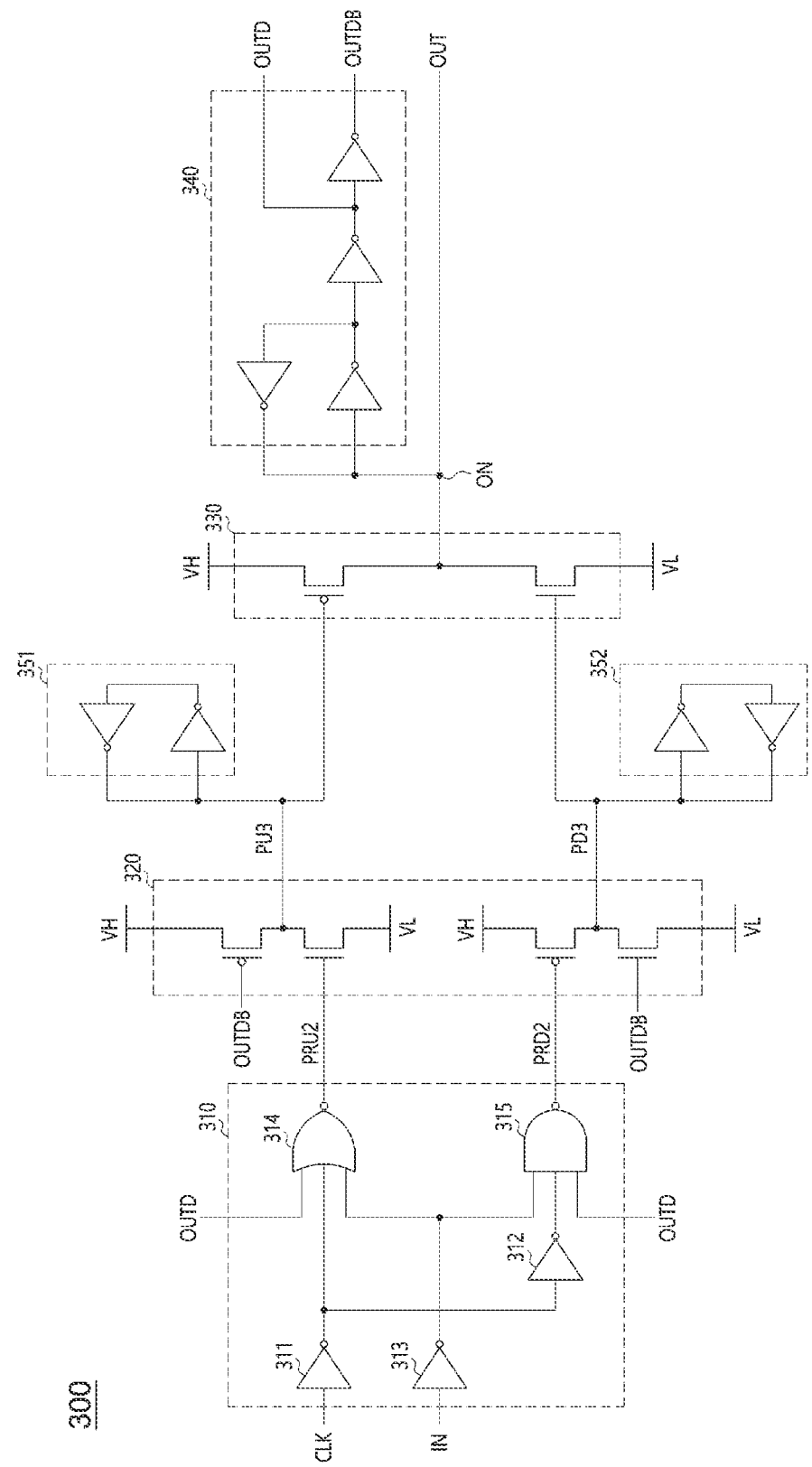
FIG. 5 is a diagram illustrating a configuration of a signal driver circuit in accordance with an embodiment.

FIG. 5 is a diagram illustrating a configuration of a signal driver circuit 300 in accordance with an embodiment. Referring to FIG. 5, the signal driver circuit 300 may receive an input signal IN and a clock signal CLK to generate an output signal OUT. The input signal IN may be a digital information signal having a high logic level and a low logic level. The logic level of the input signal IN may vary arbitrarily or according to information carried by the signal. The clock signal CLK may have a pulse that is enabled, according to the change in the logic level of the input signal IN, at a regular interval to alter the logic level of the output signal OUT. In an embodiment, the enabled interval of the clock signal CLK may be shorter than the disabled interval thereof. The signal driver circuit 300 may detect, during the enabled interval of the clock signal CLK, the logic level of the input signal IN to pull-up and pull-down drive the output signal OUT thereby changing the logic level of the output signal OUT. The signal driver circuit 300 may receive the output signal OUT as feedback and may adjust, based on the output signal OUT, the duration during which the output signal OUT is driven. The signal driver circuit 300 may disable, based on the output signal OUT, a pull-up driving signal PU3, and a pull-down driving signal PD3, which are respectively utilized to pull-up and pull-down drive the output signal OUT. When the logic level of the input signal IN stats unchanged, the signal driver circuit 300 might not generate a first pre-driving signal PRU2 and a second pre-driving signal PRD2, which are respectively utilized to generate the pull-up driving signal PU3 and the pull-down driving signal PD3. The signal driver circuit 300 may reduce, based on the output signal OUT, the power consumption of the signal driver circuit 300 by decreasing leakage current, which occurs internally in the signal driver circuit 300.

The signal driver circuit 300 may include a pre-driving circuit 310, a driving signal generating circuit 320, a main driving circuit 330, and an output control circuit 340. The pre-driving circuit 310 may receive the input signal IN, the clock signal CLK, and a delayed output signal OUTD. The pre-driving circuit 310 may generate the first pre-driving signal PRU2 and the second pre-driving signal PRD2 based on the input signal IN, the clock signal CLK, and the delayed output signal OUTD. The pre-driving circuit 310 may enable the first pre-driving signal PRU2 and the second pre-driving signal PRD2 based on the input signal IN and the clock signal CLK and may disable the first pre-driving signal PRU2 and the second pre-driving signal PRD2 based on the clock signal CLK and the delayed output signal OUTD. The delayed output signal OUTD may be generated by the output control circuit 340. The delayed output signal OUTD may have the same logic level as the output signal OUT. When the logic level of the input signal IN differs from the logic level of the delayed output signal OUTD, the pre-driving circuit 310 may enable the first pre-driving signal PRU2 and the second pre-driving signal PRD2. The pre-driving circuit 310 may detect the logic level of the input signal IN when the clock signal CLK is enabled. When the clock signal CLK is enabled and/or there occurs a rising edge of the clock signal CLK, the pre-driving circuit 310 may generate the first pre-driving signal PRU2 and the second pre-driving signal PRD2 according to the logic level of the input signal IN. The pre-driving circuit 310 may enable one of the first pre-driving signal PRU2 and the second pre-driving signal PRD2 according to the logic level of the input signal IN. For example, when the input signal IN is at a high logic level, the pre-driving circuit 310 may enable the first pre-driving signal PRU2 and may disable the second pre-driving signal PRD2. When the input signal IN is at a low logic level, the pre-driving circuit 310 may disable the first pre-driving signal PRU2 and may enable the second pre-driving signal PRD2. When the clock signal CLK is disabled and/or there occurs a falling edge of the clock signal CLK, the pre-driving circuit 310 may disable both the first pre-driving signal PRU2 and the second pre-driving signal PRD2 regardless of the logic level of the input signal IN.

The pre-driving circuit 310 may enable the first pre-driving signal PRU2 and the second pre-driving signal PRD2 when the logic level of the input signal IN changes and/or when the logic level of the input signal IN differs from the logic level of the delayed output signal OUTD. For example, the pre-driving circuit 310 may enable the first pre-driving signal PRU2 and the second pre-driving signal PRD2 when the logic level of the input signal IN changes from a high logic level to a low logic level or from a low logic level to a high logic level. When the logic level of the input signal IN stays unchanged, the pre-driving circuit 310 may keep the first pre-driving signal PRU2 and the second pre-driving signal PRD2 disabled without enabling the first pre-driving signal PRU2 and the second pre-driving signal PRD2. For instance, it is assumed that the output signal OUT and the delayed output signal OUTD are both at a low logic level. When the clock signal CLK is enabled and the input signal IN is at a high logic level, the pre-driving circuit 310 may enable the first pre-driving signal PRU2. When the logic level of the delayed output signal OUTD changes from a low logic level to a high logic level, the pre-driving circuit 310 may prevent the enabling of the first pre-driving signal PRU2. Conversely, when the clock signal CLK is enabled and the input signal IN is at a low logic level, the pre-driving circuit 310 might not enable the second pre-driving signal PRD2. Because the output signal OUT is already at a low logic level, there is no need for the pre-driving circuit 310 to enable the second pre-driving signal PRD2 and drive the output signal OUT back to a low logic level. Now, it is assumed that the output signal OUT and the delayed output signal OUTD are both at a high logic level. When the clock signal CLK is enabled and the input signal IN is at a high logic level, the pre-driving circuit 310 might not enable the first pre-driving signal PRU2. Because the output signal OUT is already at a high logic level, there is no need for the pre-driving circuit 310 to enable the first pre-driving signal PRU2 and drive the output signal OUT back to a high logic level. Conversely, when the clock signal CLK is enabled and the input signal IN is at a low logic level, the pre-driving circuit 310 may enable the second pre-driving signal PRD2. When the logic level of the delayed output signal OUTD changes from a high logic level to a low logic level, the pre-driving circuit 310 may prevent the enabling of the second pre-driving signal PRD2.

The driving signal generating circuit 320 may receive the first pre-driving signal PRU2, the second pre-driving signal PRD2 and the complementary delayed output signal OUTDB. The driving signal generating circuit 320 may generate the pull-up driving signal PU3 and the pull-down driving signal PD3 based on the first pre-driving signal PRU2, the second pre-driving signal PRD2 and the complementary delayed output signal OUTDB. The main driving circuit 330 may receive the pull-up driving signal PU3 and the pull-down driving signal PD3 to generate the output signal OUT based on the pull-up driving signal PU3 and the pull-down driving signal PD3. The output control circuit 340 may latch the output signal OUT and may sequentially delay the output signal OUT to generate the delayed output signal OUTD and the complementary delayed output signal OUTDB. The configurations of the driving signal generating circuit 320, the main driving circuit 330, and the output control circuit 340 may be substantially the same as the driving signal generating circuit 220, the main driving circuit 230, and the output control circuit 240 shown in FIG. 3, respectively. Accordingly, duplicate explanations for identical components are omitted. The signal driver circuit 300 may further include a first latch 351 and a second latch 352. The first latch 351 and the second latch 352 may be substantially similar to the first latch 251 and the second latch 252 shown in FIG. 3, respectively.

The pre-driving circuit 310 may include a first inverter 311, a second inverter 312, a third inverter 313, a NOR gate 314, and a NAND gate 315. The first inverter 311 may receive the clock signal CLK and may invert the clock signal CLK. The second inverter 312 may receive the output signal of the first inverter 311 and may invert the output signal of the first inverter 311. The third inverter 313 may receive the input signal IN and may invert the input signal IN. The NOR gate 314 may receive the output signal of the first inverter 311, the output signal of the third inverter 313, and the delayed output signal OUTD to generate the first pre-driving signal PRU2. The NAND gate 315 may receive the output signal of the second inverter 312, the output signal of the third inverter 313, and the delayed output signal OUTD to generate the second pre-driving signal PRD2. When the clock signal CLK is enabled, the input signal IN is at a high logic level, and the delayed output signal OUTD is at a low logic level, the output signals of the first inverter 311 and the third inverter 313 are both at a low logic level. Consequently, the NOR gate 314 may enable the first pre-driving signal PRU2 to a high logic level. When the clock signal CLK is enabled, the input signal IN is at a low logic level and the delayed output signal OUTD is at a high logic level, the output signals of the second inverter 312 and the third inverter 313 are both at a high logic level. Accordingly, the NAND gate 315 may enable the second pre-driving signal PRD2 to a low logic level.

Figure 6:
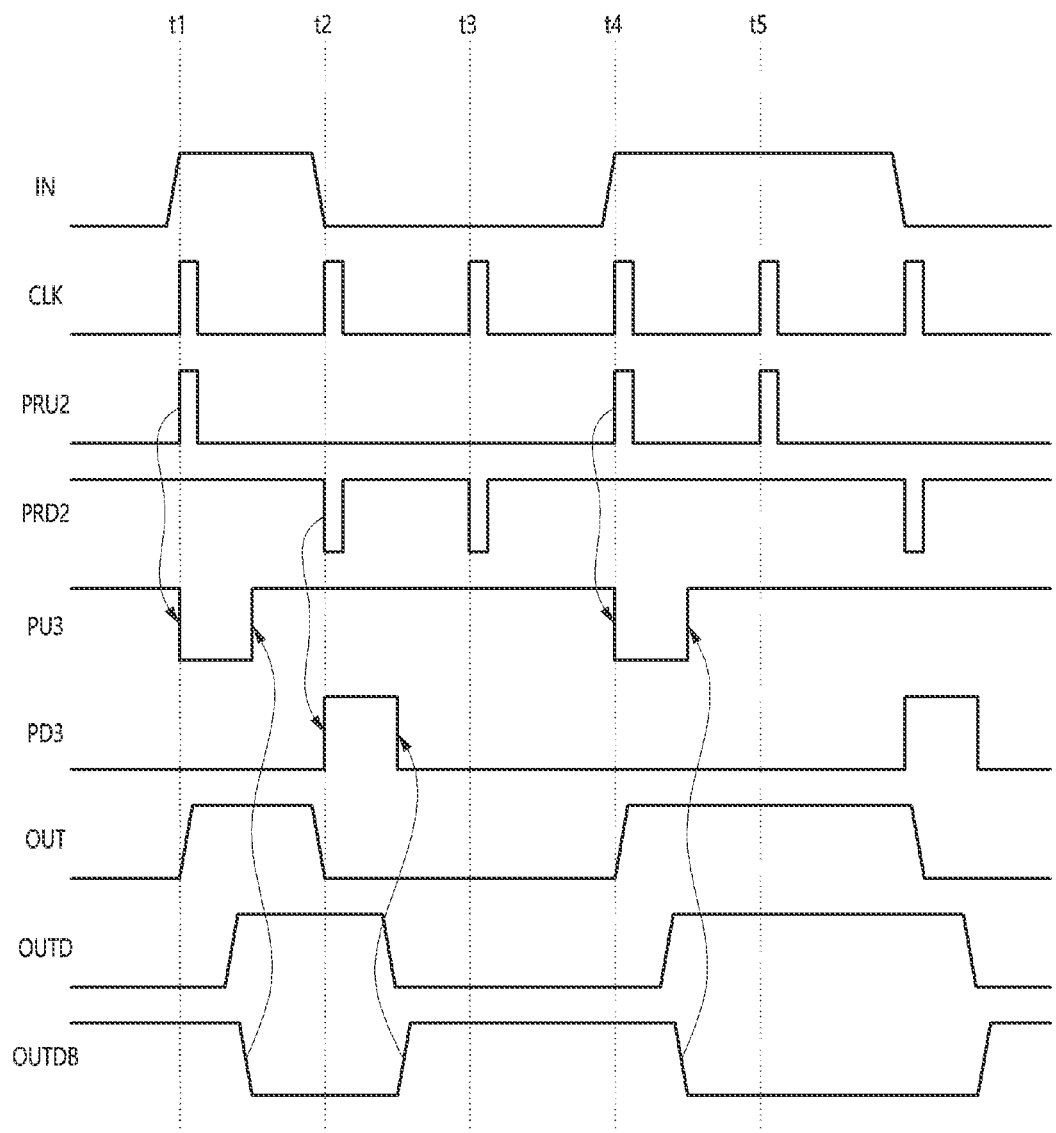
FIG. 6 is a timing diagram illustrating an operation of a signal driver circuit in accordance with an embodiment.

FIG. 6 is a timing diagram illustrating an operation of the signal driver circuit 300 in accordance with an embodiment. Hereinafter, described with reference to FIGS. 5 and 6 is the operation of the signal driver circuit 300 in accordance with an embodiment. The pre-driving circuit 300 may receive, as feedback, the delayed output signal OUTD to generate the first pre-driving signal PRU2 and the second pre-driving signal PRD2. The pre-driving circuit 310 may generate the first pre-driving signal PRU2 and the second pre-driving signal PRD2 when the logic levels are different between the delayed output signal OUTD and the input signal IN and/or when the logic level of the input signal IN changes. The pre-driving circuit 310 might not generate the first pre-driving signal PRU2 or the second pre-driving signal PRD2 when the logic level of the delayed output signal OUTD is the same as the input signal IN and/or when the logic level of the input signal IN stays unchanged. Consequently, the unnecessary toggles of the first pre-driving signal PRU2 and the second pre-driving signal PRD2 may be reduced, and the leakage current may be minimized.

At t1 when the clock signal CLK is enabled and the input signal IN is at a high logic level, the pre-driving circuit 310 may enable the first pre-driving signal PRU2 to a high logic level and the driving signal generating circuit 320 may enable the pull-up driving signal PU3 to a low logic level. The main driving circuit 330 may change the logic level of the output signal OUT to a high logic level based on the pull-up driving signal PU3. After the logic level of the output signal OUT changes to a high logic level, the logic level of the delayed output signal OUTD may also change to a high logic level and the logic level of the complementary delayed output signal OUTDB may change to a low logic level. When the logic level of the complementary delayed output signal OUTDB changes to a low logic level, the driving signal generating circuit 320 may disable the pull-up driving signal PU3 to a high logic level. At t2 when the clock signal CLK is enabled and the logic level of the input signal IN changes from a high logic level to a low logic level, the pre-driving circuit 310 may enable the second pre-driving signal PRD2 to a low logic level and the driving signal generating circuit 320 may enable the pull-down driving signal PD3 to a high logic level. The main driving circuit 330 may change the logic level of the output signal OUT to a low logic level based on the pull-down driving signal PD3. After the logic level of the output signal OUT changes to a low logic level, the logic level of the delayed output signal OUTD may change to a low logic level and the logic level of the complementary delayed output signal OUTDB may change to a high logic level. When the logic level of the complementary delayed output signal OUTDB changes to a high logic level, the driving signal generating circuit 320 may disable the pull-down driving signal PD3 to a low logic level. At t3 when the clock signal CLK is enabled and the input signal IN stays at a low logic level, the pre-driving circuit 310 might not enable the second pre-driving signal PRD2 based on the low logic level of the delayed output signal OUTD. In this case, even when the complementary delayed output signal OUTDB is at a high logic level, the second pre-driving signal PRD2 may stay disabled, which prevents leakage current from occurring between the nodes respectively receiving the first power voltage VH and the second power voltage VL in the driving signal generating circuit 320. At t4 when the clock signal CLK is enabled and the logic level of the input signal IN changes from a low logic level to a high logic level, the pre-driving circuit 310 may enable the first pre-driving signal PRU2 to a high logic level and the driving signal generating circuit 320 may enable the pull-up driving signal PU3 to a low logic level. The main driving circuit 330 may change the logic level of the output signal OUT to a high logic level based on the pull-up driving signal PU3. After the logic level of the output signal OUT changes to a high logic level, the logic level of the delayed output signal OUTD may change to a high logic level and the logic level of the complementary delayed output signal OUTDB may change to a low logic level. When the logic level of the complementary delayed output signal OUTDB changes to a low logic level, the driving signal generating circuit 320 may disable the pull-up driving signal PU3 to a high logic level. At t5 when the clock signal CLK is enabled and the input signal IN stays at a high logic level, the pre-driving circuit 310 might not enable the first pre-driving signal PRU2 based on the high logic level of the delayed output signal OUTD. In this case, even when the complementary delayed output signal OUTDB is at a low logic level, the first pre-driving signal PRU2 may stay disabled, which prevents the leakage current from occurring between the nodes respectively receiving the first power voltage VH and the second power voltage VL in the driving signal generating circuit 330. When the logic level of the input signal IN stays unchanged, the signal driver circuit 300 may prevent unnecessary toggles of the first pre-driving signal PRU2 and the second pre-driving signal PRD2 and may reduce the leakage current to minimize unnecessary power consumption.

Figure 7:
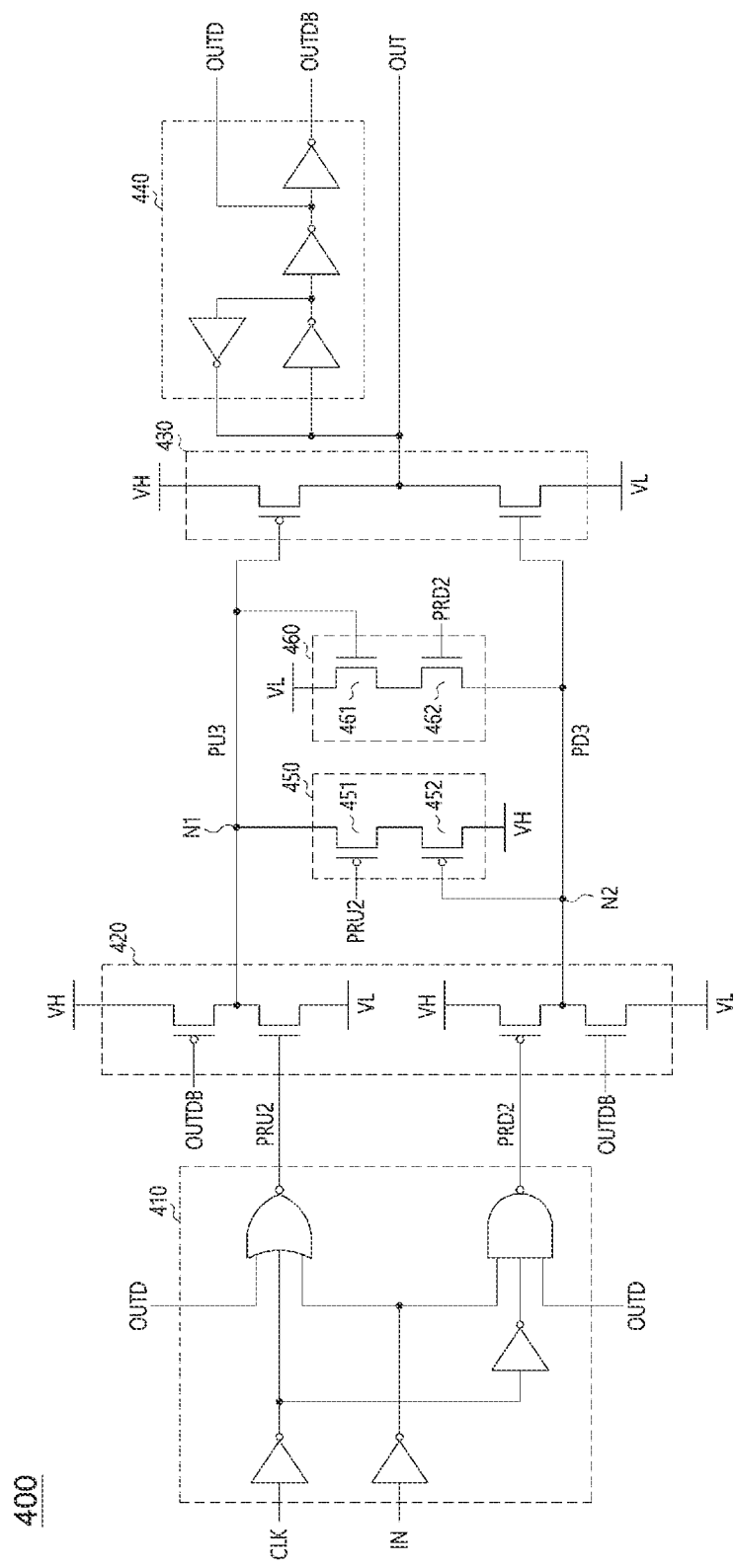
FIG. 7 is a diagram illustrating a configuration of a signal driver circuit in accordance with an embodiment.

FIG. 7 is a diagram illustrating a configuration of a signal driver circuit 400 in accordance with an embodiment. Referring to FIG. 7, the signal driver circuit 400 may receive an input signal IN and a clock signal CLK to generate an output signal OUT. The input signal IN may be a digital information signal having a high logic level and a low logic level. The logic level of the input signal IN may vary arbitrarily or according to information carried by the signal. The clock signal CLK may have a pulse that is enabled, according to the change in the logic level of the input signal IN, at a regular interval to alter the logic level of the output signal OUT. In an embodiment, the enabled interval of the clock signal CLK may be shorter than the disabled interval thereof. The signal driver circuit 400 may detect, during the enabled interval of the clock signal CLK, the logic level of the input signal IN to pull-up and pull-down drive the output signal OUT thereby changing the logic level of the output signal OUT. The signal driver circuit 400 may receive the output signal OUT as feedback and may adjust a time amount, during which the output signal OUT is driven, based on the output signal OUT. The signal driver circuit 400 may disable, based on the output signal OUT, a pull-up driving signal PU3 and a pull-down driving signal PD3, which are respectively utilized to pull-up and pull-down drive the output signal OUT. When the logic level of the input signal IN is maintained, the signal driver circuit 400 might not generate a first pre-driving signal PRU2 and a second pre-driving signal PRD2, which are respectively utilized to generate the pull-up driving signal PU3 and pull-down driving signal PD3. The signal driver circuit 400 may reduce the power consumption thereof by decreasing, based on the output signal OUT, the leakage current generated internally in the signal driver circuit 400. The signal driver circuit 400 may efficiently maintain the logic levels and/or the voltage levels of the pull-up driving signal PU3 and the pull-down driving signal PD3.

The signal driver circuit 400 may include a pre-driving circuit 410, a driving signal generating circuit 420, a main driving circuit 430, an output control circuit 440, a precharging circuit 450, and a discharging circuit 460. The pre-driving circuit 410 may receive the clock signal CLK, the input signal IN, and a delayed output signal OUTD to generate the first pre-driving signal PRU2 and the second pre-driving signal PRD2. The driving signal generating circuit 420 may generate the pull-up driving signal PU3 and pull-down driving signal PD3 based on the first pre-driving signal PRU2, the second pre-driving signal PRD2, and the complementary delayed output signal OUTDB. The main driving circuit 430 may generate the output signal OUT based on the pull-up driving signal PU3 and the pull-down driving signal PD3. The output control circuit 440 may latch the output signal OUT and may sequentially delay the output signal OUT to generate the delayed output signal OUTD and the complementary delayed output signal OUTDB. The pre-driving circuit 410 may be substantially the same as the pre-driving circuit 310 shown in FIG. 5. The driving signal generating circuit 420, the main driving circuit 430, and the output control circuit 440 may be substantially the same as the driving signal generating circuit 220, the main driving circuit 230, and the output control circuit 240 shown in FIG. 3, respectively. Accordingly, duplicate explanations for identical components are omitted.

The precharging circuit 450 may receive the first pre-driving signal PRU2 and the pull-down driving signal PD3 and may precharge the pull-up driving signal PU3 based on the first pre-driving signal PRU2 and the pull-down driving signal PD3. The precharging circuit 450 may receive the first power voltage VH and may drive, based on the pull-down driving signal PD3 and the first pre-driving signal PRU2, the pull-up driving signal PU3 to the voltage level of the first power voltage VH. The precharging circuit 450 may keep the pull-up driving signal PU3 disabled when both the pull-down driving signal PD3 and the first pre-driving signal PRU2 are disabled. The precharging circuit 450 might not drive the pull-up driving signal PU3 when either the pull-down driving signal PD3 or the first pre-driving signal PRU2 is enabled. The discharging circuit 460 may receive the second pre-driving signal PRD2 and the pull-up driving signal PU3 and may discharge the pull-down driving signal PD3 based on the second pre-driving signal PRD2 and the pull-up driving signal PU3. The discharging circuit 460 may receive the second power voltage VL and may drive, based on the pull-up driving signal PU3 and the second pre-driving signal PRD2, the pull-down driving signal PD3 to the voltage level of the second power voltage VL. The discharging circuit 460 may keep the pull-down driving signal PD3 disabled when both the pull-up driving signal PU3 and the second pre-driving signal PRD2 are disabled. The discharging circuit 460 might not drive the pull-down driving signal PD3 when either the pull-up driving signal PU3 or the second pre-driving signal PRD2 is enabled.

The precharging circuit 450 may include a first transistor 451 and a second transistor 452. Both the first transistor 451 and the second transistor 452 may be P-channel MOS transistors. The gate of the first transistor 451 may receive the pull-down driving signal PD3 and the source of the first transistor 451 may receive the first power voltage VH. The gate of the second transistor 452 may receive the first pre-driving signal PRU2, the source of the second transistor 452 may be connected to the drain of the first transistor 451, and the source of the second transistor 452 may be coupled to the pull-up driving signal PU3. When both the pull-down driving signal PD3 and the first pre-driving signal PRU2 are at a low logic level, current may be provided from the node, to which the first power voltage VH is supplied, to the pull-up driving signal PU3 through the first transistor 451 and the second transistor 452 to drive the pull-up driving signal PU3 to a high logic level.

The discharging circuit 460 may include a third transistor 461 and a fourth transistor 462. Both the third transistor 461 and the fourth transistor 462 may be N-channel MOS transistors. The gate of the third transistor 461 may receive the pull-up driving signal PU3 and the drain of the third transistor 461 may receive the second power voltage VL. The gate of the fourth transistor 462 may receive the second pre-driving signal PRD2, the drain of the fourth transistor 462 may be connected to the source of the third transistor 461, and the source of the fourth transistor 462 may be coupled to the pull-down driving signal PD3. When both the pull-up driving signal PU3 and the second pre-driving signal PRD2 are at a high logic level, current may flow from the pull-down driving signal PD3 to the node, to which the second power voltage VL is supplied, through the third transistor 461 and the fourth transistor 462 to drive the pull-down driving signal PD3 to a low logic level.

The precharging circuit 450 and the discharging circuit 460 may keep the pull-up driving signal PU3 and the pull-down driving signal PD3 disabled when the logic level of the input signal IN stays unchanged and/or when there is no need for changes in the logic levels of the pull-up driving signal PU3 and the pull-down driving signal PD3. The precharging circuit 450 and the discharging circuit 460 may be configured with fewer transistors compared to the first latch 251 and the second latch 252 shown in FIG. 3, which may reduce the size of the signal driver circuit 400.

Figure 8:
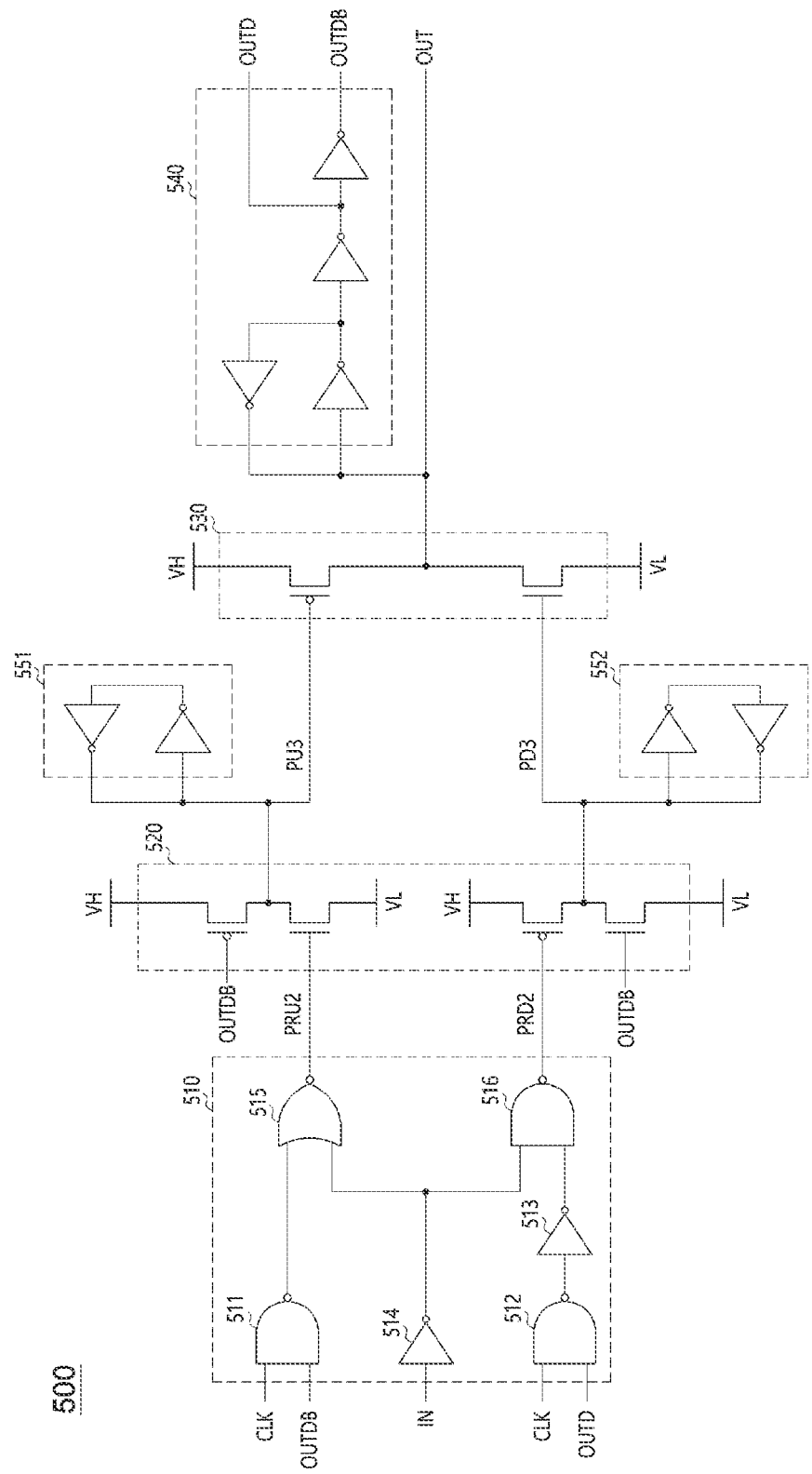
FIG. 8 is a diagram illustrating a configuration of a signal driver circuit in accordance with an embodiment.

FIG. 8 is a diagram illustrating a configuration of a signal driver circuit 500 in accordance with an embodiment. Referring to FIG. 8, the signal driver circuit 500 may include a pre-driving circuit 510, a driving signal generating circuit 520, a main driving circuit 530, an output control circuit 540, a first latch 551, and a second latch 552. Except for the pre-driving circuit 510, the signal driver circuit 500 may have substantially the same as the signal driver circuit 510 shown in FIG. 5. Accordingly, duplicate explanations for identical components are omitted. The pre-driving circuit 510 may generate the first pre-driving signal PRU2 and the second pre-driving signal PRD2 based on the input signal IN, the clock signal CLK, and the delayed output signal OUTD. The pre-driving circuit 510 may receive the input signal IN, the clock signal CLK, the delayed output signal OUTD, and the complementary delayed output signal OUTDB. The pre-driving circuit 510 may detect the logic level of the input signal IN when the clock signal CLK is enabled. The pre-driving circuit 510 may enable the first pre-driving signal PRU2 and the second pre-driving signal PRD2 according to the logic level of the input signal IN when the clock signal CLK is enabled. The pre-driving circuit 510 may disable the first pre-driving signal PRU2 and the second pre-driving signal PRD2 based on the clock signal CLK, the delayed output signal OUTD, and the complementary delayed output signal OUTDB. When the logic level of the input signal IN differs from the logic level of the delayed output signal OUTD, the pre-driving circuit 510 may enable the first pre-driving signal PRU2 and the second pre-driving signal PRD2. When the logic level of the input signal IN is the same as the logic level of the delayed output signal OUTD, the pre-driving circuit 510 might not enable the first pre-driving signal PRU2 and the second pre-driving signal PRD2.

The pre-driving circuit 510 may include a first NAND gate 511, a second NAND gate 512, a first inverter 513, a second inverter 514, a NOR gate 515, and a third NAND gate 516. The first NAND gate 511 may receive the clock signal CLK and the complementary delayed output signal OUTDB. The second NAND gate 512 may receive the clock signal CLK and the delayed output signal OUTD. The first inverter 513 may receive the output signal of the second NAND gate 512 and invert the output signal of the second NAND gate 512. The second inverter 514 may receive the input signal IN and invert the input signal IN. The NOR gate 515 may receive the output signal of the first NAND gate 511 and the output signal of the second inverter 514 to generate the first pre-driving signal PRU2. The third NAND gate 516 may receive the output signal of the first inverter 513 and the output signal of the second inverter 514 to generate the second pre-driving signal PRD2. It is assumed that the delayed output signal OUTD is at a low logic level. When the clock signal CLK is enabled and the input signal IN is at a high logic level, the output signal of the first NAND gate 511 and the output signal of the second inverter 514 may be at a low logic level and the output signal of the first inverter 513 may be at a low logic level. Therefore, the NOR gate 515 may enable the first pre-driving signal PRU2 to a high logic level and the third NAND gate 516 may disable the second pre-driving signal PRD2 to a high logic level. When the input signal IN is at a low logic level, the output signal of the first NAND gate 511 and the output signal of the first inverter 513 may be at a low logic level and the output signal of the second inverter 514 may be at a high logic level. Therefore, the NOR gate 515 may disable the first pre-driving signal PRU2 to a low logic level and the third NAND gate 516 may disable the second pre-driving signal PRD2 to a high logic level.

It is conversely assumed that the delayed output signal OUTD is at a high logic level. When the clock signal CLK is enabled and the input signal IN is at a low logic level, the output signal of the first NAND gate 511, the output signal of the first inverter 513, and the output signal of the second inverter 514 may all be at a high logic level. Therefore, the NOR gate 515 may disable the first pre-driving signal PRU2 to a low logic level, and the third NAND gate 516 may enable the second pre-driving signal PRD2 to a low logic level. When the input signal IN is at a high logic level, the output signal of the first NAND gate 511 and the output signal of the first inverter 513 may be at a high logic level, and the output signal of the second inverter 514 may be at a low logic level. Therefore, the NOR gate 515 may disable the first pre-driving signal PRU2 to a low logic level, and the third NAND gate 516 may disable the second pre-driving signal PRD2 to a high logic level.

Figure 9:
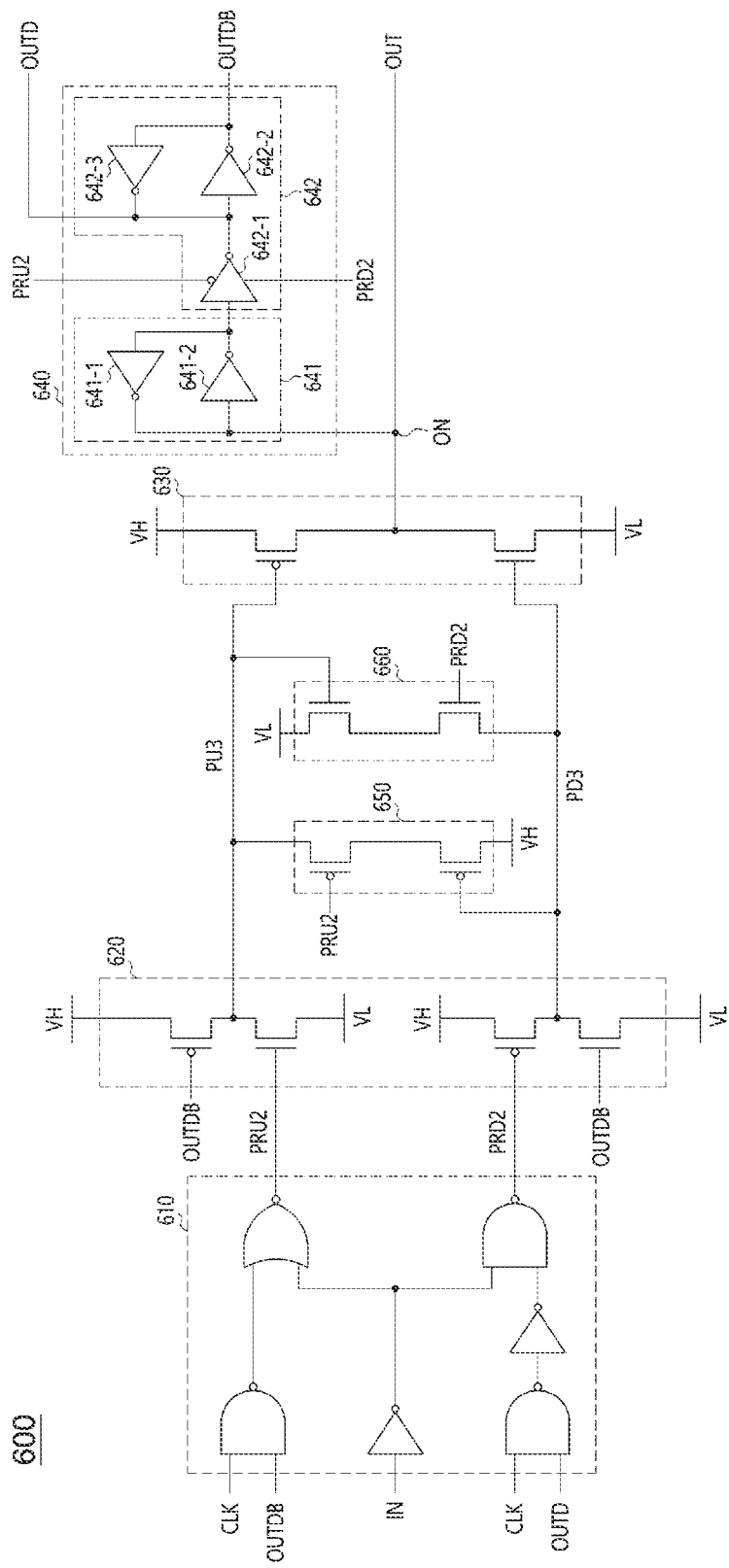
FIG. 9 is a diagram illustrating a configuration of a signal driver circuit in accordance with an embodiment.

FIG. 9 is a diagram illustrating a configuration of a signal driver circuit 600 in accordance with an embodiment. Referring to FIG. 9, the signal driver circuit 600 may include a pre-driving circuit 610, a driving signal generating circuit 620, a main driving circuit 630, an output control circuit 640, a precharging circuit 650, and a discharging circuit 660. The pre-driving circuit 610 may be substantially the same as the pre-driving circuit 510 shown in FIG. 8. The driving signal generating circuit 620 and the main driving circuit 630 may be substantially the same as the driving signal generating circuit 320 and the main driving circuit 330 shown in FIG. 5, respectively. The precharging circuit 650 and the discharging circuit 660 may be substantially the same as the precharging circuit 450 and the discharging circuit 460 shown in FIG. 7, respectively. Accordingly, duplicate explanations for identical components are omitted.

The output control circuit 640 may latch the output signal OUT. The output control circuit 640 may receive the first pre-driving signal PRU2 and the second pre-driving signal PRD2 from the pre-driving circuit 610 and may generate the delayed output signal OUTD and the complementary delayed output signal OUTDB from the output signal OUT based on the first pre-driving signal PRU2 and the second pre-driving signal PRD2. By generating the delayed output signal OUTD and the complementary delayed output signal OUTDB based on the first pre-driving signal PRU2 and the second pre-driving signal PRD2, the output control circuit 640 may ensure sufficient pulse widths of the delayed output signal OUTD and the complementary delayed output signal OUTDB. When the first pre-driving signal PRU2 and the second pre-driving signal PRD2 are disabled, the output control circuit 640 may delay the output signal OUT to generate the delayed output signal OUTD and the complementary delayed output signal OUTDB. The output control circuit 640 might not generate the delayed output signal OUTD or the complementary delayed output signal OUTDB from the output signal OUT when either the first pre-driving signal PRU2 or the second pre-driving signal PRD2 is enabled.

The output control circuit 640 may include a cross-coupled inverter 641 and a delay circuit 642. The cross-coupled inverter 641 may be connected to the output node ON to receive the output signal OUT. The cross-coupled inverter 641 may receive the output signal OUT and may maintain the logic level and/or the voltage level of the output signal OUT. The delay circuit 642 may receive the output signal of the cross-coupled inverter 641 and the first pre-driving signal PRU2 and the second pre-driving signal PRD2. Based on the first pre-driving signal PRU2 and the second pre-driving signal PRD2, the delay circuit 642 may delay the output signal of the cross-coupled inverter 641 to generate the delayed output signal OUTD and the complementary delayed output signal OUTDB. When the first pre-driving signal PRU2 and the second pre-driving signal PRD2 are disabled, the delay circuit 642 may sequentially delay the output signal of the cross-coupled inverter 641 to generate the delayed output signal OUTD and the complementary delayed output signal OUTDB. When either the first pre-driving signal PRU2 or the second pre-driving signal PRD2 is enabled, the delay circuit 642 might not generate the delayed output signal OUTD or the complementary delayed output signal OUTDB from the output signal of the cross-coupled inverter 641. Additionally, the delay circuit 642 may latch and/or maintain the logic levels and/or the voltage levels of the delayed output signal OUTD and the complementary delayed output signal OUTDB.

The cross-coupled inverter 641 may include a first inverter 641-1 and a second inverter 641-2. The input node of the first inverter 641-1 may be connected to the output node ON to receive the output signal OUT. The output node of the first inverter 641-1 may be connected to the delay circuit 642. The input node of the second inverter 641-2 may be connected to the output node of the first inverter 641-1. The output node of the second inverter 641-2 may be connected to the input node of the first inverter 641-1 and the output node ON. The delay circuit 642 may include a third inverter 642-1 and a fourth inverter 642-2. The input node of the third inverter 642-1 may be connected to the output node of the first inverter 641-1 to receive the output signal of the first inverter 641-1. The delayed output signal OUTD may be generated from the output node of the third inverter 642-1. The third inverter 642-1 may be a tri-state inverter and may receive the first pre-driving signal PRU2 as a PMOS control signal and the second pre-driving signal PRD2 as a NMOS control signal. When the first pre-driving signal PRU2 is disabled to a low logic level and the second pre-driving signal PRD2 is disabled to a high logic level, the third inverter 642-1 may invert the output signal of the first inverter 641-1 to generate the delayed output signal OUTD. The third inverter 642-1 may be deactivated when the first pre-driving signal PRU2 is enabled to a high logic level or the second pre-driving signal PRD2 is enabled to a low logic level. The input node of the fourth inverter 642-2 may be connected to the output node of the third inverter 642-1 to receive the delayed output signal OUTD. The fourth inverter 642-2 may invert the delayed output signal OUTD to generate the complementary delayed output signal OUTDB. The delay circuit may further include a fifth inverter 642-3. The input node of the fifth inverter 642-3 may be connected to the output node of the fourth inverter 642-2 to receive the complementary delayed output signal OUTDB. The output node of the fifth inverter 642-3 may be connected to the output node of the third inverter 642-1 and the input node of the fourth inverter 642-2. The fifth inverter 642-3 together with the fourth inverter 642-2 may form a latch to maintain the logic levels of the delayed output signal OUTD and the complementary delayed output signal OUTDB.

Figure 10:
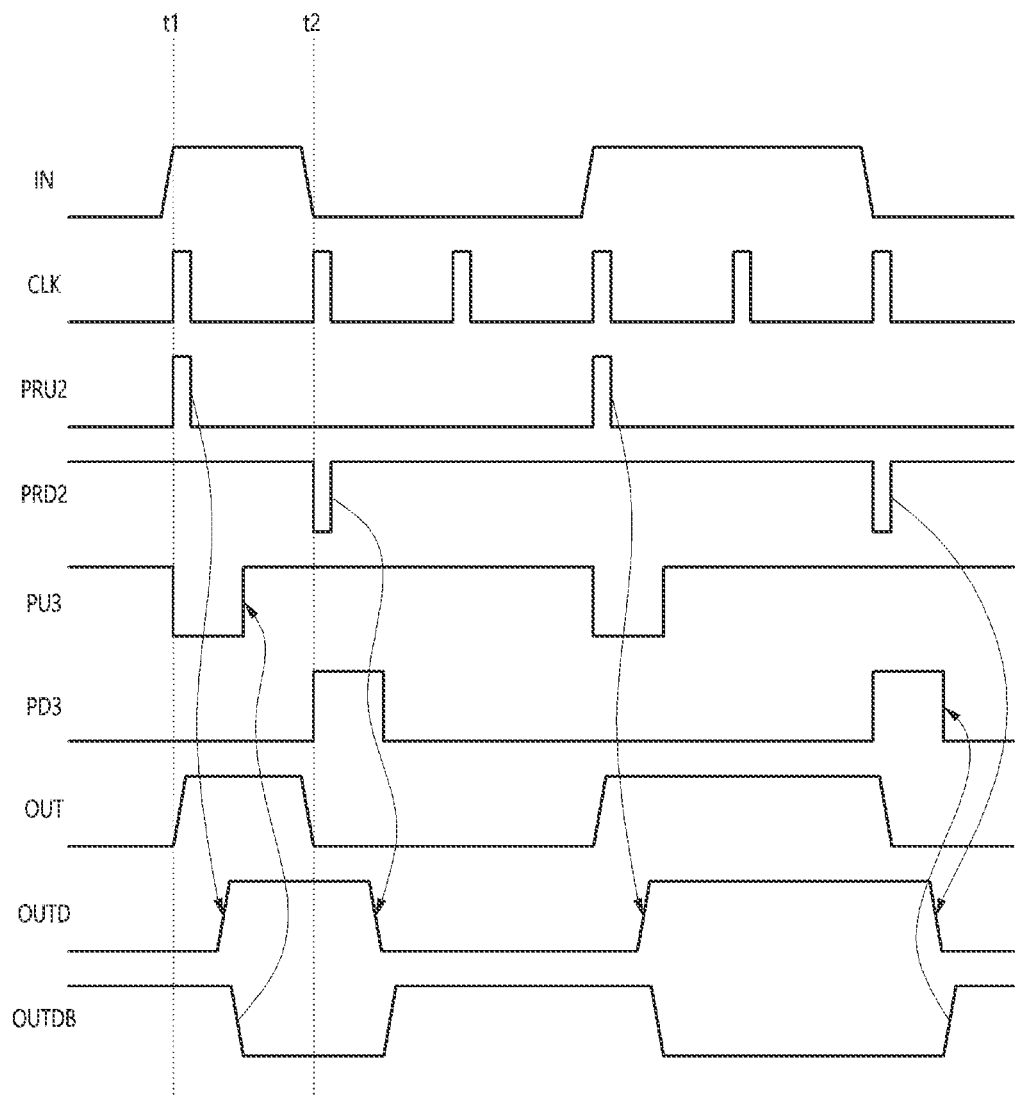
FIG. 10 is a timing diagram illustrating an operation of a signal driver circuit in accordance with an embodiment.

FIG. 10 is a timing diagram illustrating an operation of a signal driver circuit 600 in accordance with an embodiment. Hereinafter, described with reference to FIGS. 9 and 10 is the operation of the signal driver circuit 600 in accordance with an embodiment. At t1 when the clock signal CLK is enabled and the logic level of the input signal IN is a high logic level, the pre-driving circuit 610 may enable the first pre-driving signal PRU2 to a high logic level and may keep the second pre-driving signal PRD2 disabled. The driving signal generating circuit 620 may enable the pull-up driving signal PU3 to a low logic level based on the first pre-driving signal PRU2 and the main driving circuit 630 may change the logic level of the output signal OUT to a high logic level. When the clock signal CLK is disabled, the first pre-driving signal PRU2 may be disabled to a low logic level. In synchronization with the falling edge of the first pre-driving signal PRU2, the output control circuit 640 may sequentially delay the output signal OUT to generate the delayed output signal OUTD of a high logic level and the complementary delayed output signal OUTDB of a low logic level. At t2 when the clock signal CLK is enabled and the logic level of the input signal IN is a low logic level, the pre-driving circuit 610 may keep the first pre-driving signal PRU2 disabled and may enable the second pre-driving signal PRD2 to a low logic level. In synchronization with the falling edge of the second pre-driving signal PRD2, the third inverter 642-1 of the delay circuit 642 may be deactivated. The delayed output signal OUTD may float but may stay at the current logic level for a short time. The driving signal generating circuit 610 may enable the pull-down driving signal PD3 to a high logic level based on the second pre-driving signal PRD2 and the main driving circuit 630 may change the logic level of the output signal OUT to a low logic level. When the clock signal CLK is disabled, the second pre-driving signal PRD2 may be disabled to a high logic level. In synchronization with the rising edge of the second pre-driving signal PRD2, the output control circuit 640 may sequentially delay the output signal OUT to generate the delayed output signal OUTD of a low logic level and the complementary delayed output signal OUTDB of a high logic level. The driving signal generating circuit 620 may disable the pull-up driving signal PU3 and the pull-down driving signal PD3 based on the complementary delayed output signal OUTDB. When the complementary delayed output signal OUTDB is fed-back from the fourth inverter 642-2 of the delay circuit 642 to the driving signal generating circuit 620 within a short amount of time, the enabled intervals of the pull-up driving signal PU3 and the pull-down driving signal PD3 may decrease. When the output control circuit 640 generates the complementary delayed output signal OUTDB based on the first pre-driving signal PRU2 and the second pre-driving signal PRD2, the complementary delayed output signal OUTDB may be generated after there occur the falling edge of the first pre-driving signal PRU2 and the rising edge of the second pre-driving signal PRD2, which ensures sufficient enabled intervals of the pull-up driving signal PU3 and the pull-down driving signal PD3, which are generated from the driving signal generating circuit 620.

Figure 11:
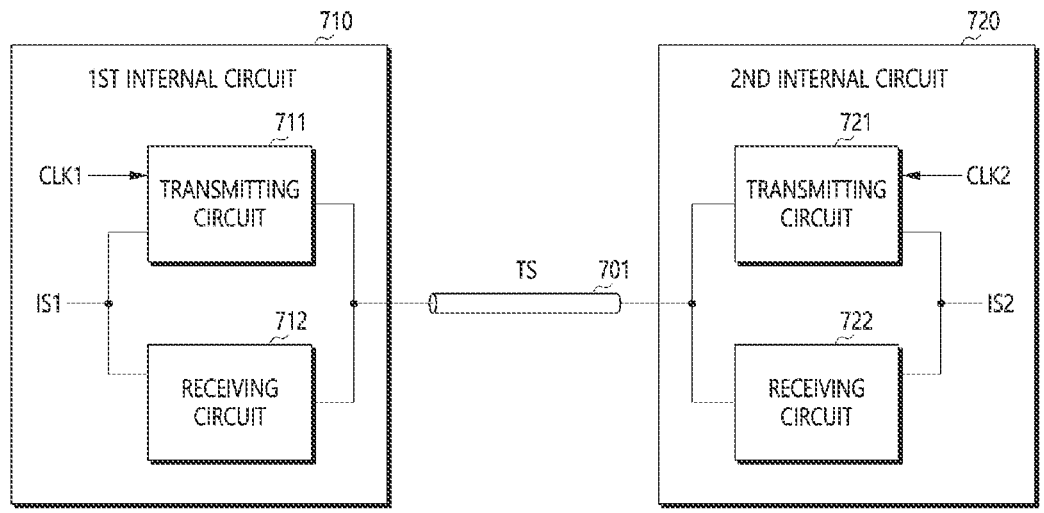
FIG. 11 is a diagram illustrating a configuration of a semiconductor apparatus in accordance with an embodiment.

FIG. 11 is a diagram illustrating a configuration of a semiconductor apparatus 700 in accordance with an embodiment. Referring to FIG. 11, the semiconductor apparatus 700 may include a first internal circuit 710 and a second internal circuit 720. The first internal circuit 710 and the second internal circuit 720 may be connected to each other through a signal transmission line 701. The signal transmission line 701 may perform bidirectional signal transmission between the first internal circuit 710 and the second internal circuit 720. Based on the internal signal IS1 of the first internal circuit 710, the first internal circuit 710 may generate a transmission signal TS and may transmit the transmission signal TS to the second internal circuit 720 through the signal transmission line 701. The first internal circuit 710 may receive the transmission signal TS transmitted from the second internal circuit 720 through the signal transmission line 701 and may generate the internal signal IS1 according to the transmission signal TS. Based on the internal signal IS2 of the second internal circuit 720, the second internal circuit 720 may generate the transmission signal TS and may transmit the transmission signal TS to the first internal circuit 710 through the signal transmission line 701. The second internal circuit 720 may receive the transmission signal TS transmitted from the first internal circuit 710 through the signal transmission line 701 and may generate the internal signal IS2 based on the transmission signal TS.

The first internal circuit 710 may include a transmitting circuit 711 and a receiving circuit 712. The transmitting circuit 711 may generate the transmission signal TS from the internal signal IS1 of the first internal circuit 710. The transmitting circuit 711 may receive the clock signal CLK1 and may generate the transmission signal TS based on the clock signal CLK1 and the internal signal IS1. The transmitting circuit 711 may include any one of the signal driver circuits 100 to 600 shown in FIGS. 1, 3, 5, 7, 8, and 9. The transmitting circuit 711 may output the transmission signal TS to the signal transmission line 701. The receiving circuit 712 may receive the transmission signal TS transmitted from the second internal circuit 720 through the signal transmission line 701. The receiving circuit 712 may generate the internal signal IS1 based on the transmission signal TS.

The second internal circuit 720 may include a transmitting circuit 721 and a receiving circuit 722. The transmitting circuit 721 may generate the transmission signal TS from the internal signal IS2 of the second internal circuit 720. The transmitting circuit 721 may receive the clock signal CLK2 and may generate the transmission signal TS based on the clock signal CLK2 and the internal signal IS2. The transmitting circuit 721 may include any one of the signal driver circuits 100 to 600 shown in FIGS. 1, 3, 5, 7, 8, and 9. The transmitting circuit 721 may output the transmission signal TS to the signal transmission line 701. The receiving circuit 722 may receive the transmission signal TS transmitted from the first internal circuit 710 through the signal transmission line 701. The receiving circuit 722 may generate the internal signal IS2 based on the transmission signal TS.

Figure 12:
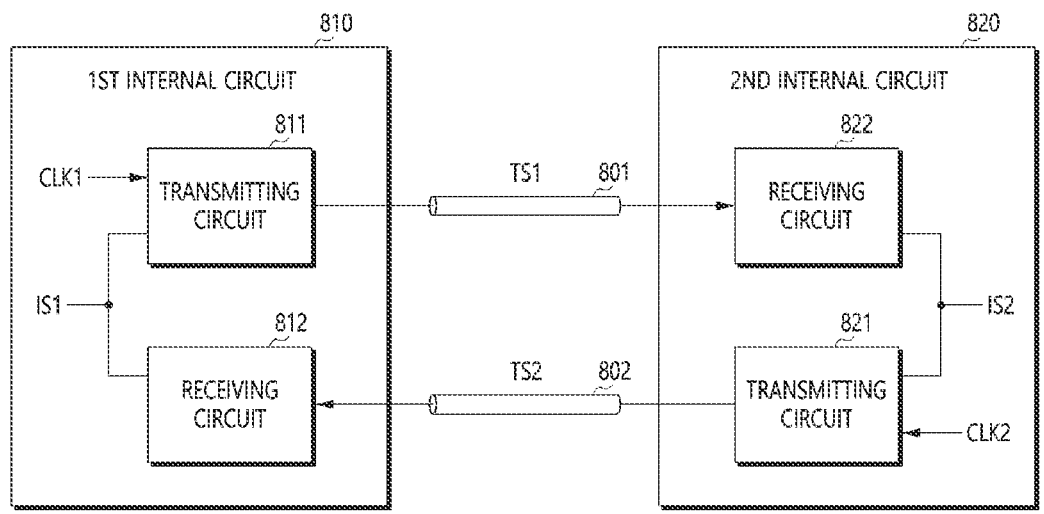
FIG. 12 is a diagram illustrating a configuration of a semiconductor apparatus in accordance with an embodiment.

FIG. 12 is a diagram illustrating a configuration of a semiconductor apparatus 800 in accordance with an embodiment. Referring to FIG. 12, the semiconductor apparatus 800 may include a first internal circuit 810 and a second internal circuit 820. The first internal circuit 810 and the second internal circuit 820 may be connected to each other through a first signal transmission line 801 and a second signal transmission line 802. The first signal transmission line 801 may perform unidirectional signal transmission from the first internal circuit 810 to the second internal circuit 820. The second signal transmission line 802 may perform unidirectional signal transmission from the second internal circuit 820 to the first internal circuit 810. Based on the internal signal IS1 of the first internal circuit 810, the first internal circuit 810 may generate the first transmission signal TS1 and may transmit the first transmission signal TS1 to the second internal circuit 820 through the first signal transmission line 801. The first internal circuit 810 may receive the second transmission signal TS2 transmitted from the second internal circuit 820 through the second signal transmission line 802 and may generate the internal signal IS1 based on the second transmission signal TS2. Based on the internal signal IS2 of the second internal circuit 820, the second internal circuit 820 may generate the second transmission signal TS2 and may transmit the second transmission signal TS2 to the first internal circuit 810 through the second signal transmission line 802. The second internal circuit 820 may receive the first transmission signal TS1 transmitted from the first internal circuit 810 through the first signal transmission line 801 and may generate the internal signal IS2 based on the first transmission signal TS1.

The first internal circuit 810 may include a transmitting circuit 811 and a receiving circuit 812. The transmitting circuit 811 may generate the first transmission signal TS1 from the internal signal IS1 of the first internal circuit 810. The transmitting circuit 811 may receive the clock signal CLK1 and may generate the first transmission signal TS1 based on the clock signal CLK1 and the internal signal IS1. The transmitting circuit 811 may include any one of the signal driver circuits 100 to 600 shown in FIGS. 1, 3, 5, 7, 8, and 9. The transmitting circuit 811 may output the first transmission signal TS1 to the first signal transmission line 801. The receiving circuit 812 may receive the second transmission signal TS2 transmitted from the second internal circuit 820 through the second signal transmission line 802. The receiving circuit 812 may generate the internal signal IS1 based on the second transmission signal TS2.

The second internal circuit 820 may include a transmitting circuit 821 and a receiving circuit 822. The transmitting circuit 821 may generate the second transmission signal TS2 from the internal signal IS2 of the second internal circuit 820. The transmitting circuit 821 may receive the clock signal CLK2 and may generate the second transmission signal TS2 based on the clock signal CLK2 and the internal signal IS2. The transmitting circuit 821 may include any one of the signal driver circuits 100 to 600 shown in FIGS. 1, 3, 5, 7, 8, and 9. The transmitting circuit 821 may output the second transmission signal TS2 to the second signal transmission line 802. The receiving circuit 822 may receive the first transmission signal TS1 transmitted from the first internal circuit 810 through the first signal transmission line 801. The receiving circuit 822 may generate the internal signal IS2 based on the first transmission signal TS1.

Figure 13:
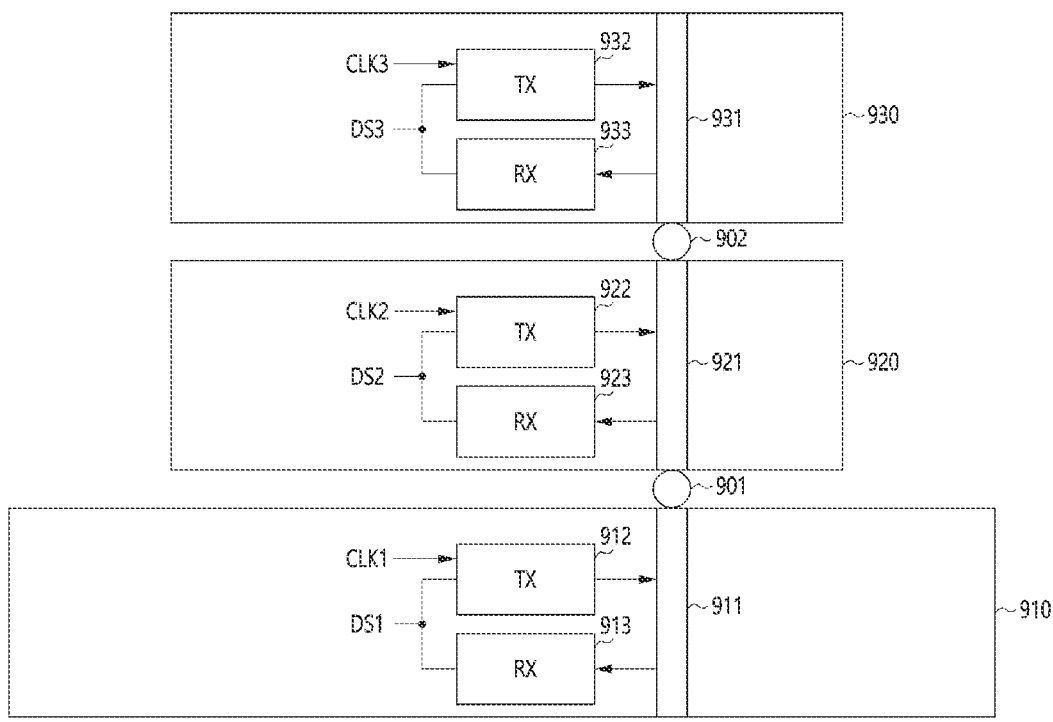
FIG. 13 is a diagram illustrating a configuration of a semiconductor apparatus in accordance with an embodiment.

FIG. 13 is a diagram illustrating a configuration of a semiconductor apparatus 900 in accordance with an embodiment. Referring to FIG. 13, the semiconductor apparatus 900 may include a first die 910, a second die 920, and a third die 930. The first to third dies 910 to 930 may be stacked sequentially. The second die 920 may be stacked on the upper side of the first die 910 and the third die 930 may be stacked on the upper side of the second die 920. The first die 910 may be a base die configured to control the second and third dies 920 and 930 to perform data input/output operations and configured to communicate with external devices of the semiconductor apparatus 900. The second and third dies 920 and 930 may be core dies configured to perform data input/output operations under the control of the first die 910. The first to third dies 910 to 930 may be connected through the Through Silicon Vias (TSVs). The Through Silicon Via 911 of the first die 910 may be electrically connected to the Through Silicon Via 921 of the second die 920 and the Through Silicon Via 931 of the third die 930. The Through Silicon Via 911 of the first die 910 and the Through Silicon Via 921 of the second die 920 may be connected through the metal bump 901 and the Through Silicon Via 921 of the second die 920 and the Through Silicon Via 931 of the third die 930 may be connected through the metal bump 902. The first to third dies 910 to 930 may communicate with one another by transmitting signals through the Through Silicon Vias 911, 921, and 931 or by receiving signals transmitted through the Through Silicon Vias 911, 921, and 931.

The first die 910 may include a transmitting circuit (TX) 912 and a receiving circuit (RX) 913. Based on the internal signal DS1 of the first die 910, the transmitting circuit 912 may generate a transmission signal and may transmit the transmission signal to the second and third dies 920 and 930 through the Through Silicon Vias 911, 921, and 931. The transmitting circuit 912 may receive the clock signal CLK1 and may generate the transmission signal based on the clock signal CLK1 and the internal signal DS1. The transmitting circuit 912 may include at least one of the signal driver circuits 100 to 600 shown in FIGS. 1, 3, 5, 7, 8, and 9. The receiving circuit 913 may receive the transmission signal transmitted from the second and third dies 920 and 930 through the Through Silicon Vias 911, 921, and 931. The receiving circuit 913 may generate the internal signal DS1 based on the transmission signal.

The second die 920 may include a transmitting circuit (TX) 922 and a receiving circuit (RX) 923. Based on the internal signal DS2 of the second die 920, the transmitting circuit 922 may generate a transmission signal and may transmit the transmission signal to the first die 910 through the Through Silicon Vias 911, 921, and 931. The transmitting circuit 922 may receive the clock signal CLK2 and may generate the transmission signal based on the clock signal CLK2 and the internal signal DS2. The transmitting circuit 922 may include at least one of the signal driver circuits 100 to 600 shown in FIGS. 1, 3, 5, 7, 8, and 9. The receiving circuit 923 may receive the transmission signal transmitted from the first die 910 through the Through Silicon Vias 911, 921, and 931. The receiving circuit 923 may generate the internal signal DS2 based on the transmission signal.

The third die 930 may include a transmitting circuit (TX) 932 and a receiving circuit (RX) 933. Based on the internal signal DS3 of the third die 930, the transmitting circuit 932 may generate a transmission signal and transmit the transmission signal to the first die 910 through the Through Silicon Vias 911, 921, and 931. The transmitting circuit 932 may receive the clock signal CLK3 and may generate the transmission signal based on the clock signal CLK3 and the internal signal DS3. The transmitting circuit 932 may include at least one of the signal driver circuits 100 to 600 shown in FIGS. 1, 3, 5, 7, 8, and 9. The receiving circuit 933 may receive the transmission signal transmitted from the first die 910 through the Through Silicon Vias 911, 921, and 931. The receiving circuit 933 may generate the internal signal DS3 based on the transmission signal.

While certain embodiments have been described above, it will be understood to those skilled in the art that the embodiments described are by way of example only. Accordingly, the signal driver circuit, and a semiconductor apparatus using the same, should not be limited based on the described embodiments. Rather, the signal driver circuit, and a semiconductor apparatus using the same, described herein should only be limited in light of the claims that follow when taken in conjunction with the above description and accompanying drawings.

What is claimed is:

1. A signal driver circuit comprising:
    a pre-driving circuit configured to generate a first pre-driving signal and a second pre-driving signal based on an input signal and a clock signal;
    a driving signal generating circuit configured to generate a pull-up driving signal based on the first pre-driving signal and a complementary delayed output signal and configured to generate a pull-down driving signal based on the second pre-driving signal and the complementary delayed output signal;
    a main driving circuit configured to generate an output signal based on the pull-up driving signal and the pull-down driving signal; and
    an output control circuit configured to latch the output signal and configured to delay the output signal to generate a delayed output signal and the complementary delayed output signal.

2. The signal driver circuit of claim 1, wherein the pre-driving circuit is configured to enable the first pre-driving signal and disable the second pre-driving signal when the clock signal is enabled and the input signal has a first logic level and configured to disable the first pre-driving signal and enable the second pre-driving signal when the clock signal is enabled and the input signal has a second logic level.

3. The signal driver circuit of claim 1, wherein the pre-driving circuit is configured to receive the delayed output signal, configured to enable the first pre-driving signal and the second pre-driving signal based on the input signal and the clock signal, and configured to disable the first pre-driving signal and the second pre-driving signal based on the clock signal and the delayed output signal.

4. The signal driver circuit of claim 3, wherein the pre-driving circuit is configured to enable, when the clock signal is enabled and logic levels are different between the input signal and the delayed output signal, the first pre-driving signal and the second pre-driving signal according to the logic level of the input signal.

5. The signal driver circuit of claim 1, wherein the driving signal generating circuit includes:
    a pull-up driving signal generating circuit configured to enable the pull-up driving signal based on the first pre-driving signal and configured to disable the pull-up driving signal based on the complementary delayed output signal; and
    a pull-down driving signal generating circuit configured to enable the pull-down driving signal based on the second pre-driving signal and configured to disable the pull-down driving signal based on the complementary delayed output signal.

6. The signal driver circuit of claim 1, wherein the output control circuit includes:
    a cross-coupled inverter configured to latch the output signal; and
    a delay circuit configured to sequentially delay an output signal of the cross-coupled inverter to generate the delayed output signal and the complementary delayed output signal.

7. The signal driver circuit of claim 1, wherein the output control circuit is configured to receive the first pre-driving signal and the second pre-driving signal and configured to generate, based on the first pre-driving signal and the second pre-driving signal, the delayed output signal and the complementary delayed output signal from the output signal.

8. The signal driver circuit of claim 1,
wherein the output control circuit is configured to receive the first pre-driving signal and the second pre-driving signal, and
wherein the output control circuit includes:
   a cross-coupled inverter configured to latch the output signal; and
   a delay circuit configured to sequentially delay, when the first pre-driving signal and the second pre-driving signal are disabled, an output signal of the cross-coupled inverter to generate the delayed output signal and the complementary delayed output signal.

9. The signal driver circuit of claim 1, further comprising:
a first latch configured to maintain a voltage level of the pull-up driving signal; and
a second latch configured to maintain a voltage level of the pull-down driving signal.

10. The signal driver circuit of claim 1, further comprising:
   a precharging circuit configured to precharge the pull-up driving signal based on the first pre-driving signal and the pull-down driving signal; and
   a discharging circuit configured to discharge the pull-down driving signal based on the second pre-driving signal and the pull-up driving signal.

11. The signal driver circuit of claim 1, wherein the pre-driving circuit is configured to generate the first pre-driving signal and the second pre-driving signal based on the input signal, the clock signal, and the delayed output signal.

12. The signal driver circuit of claim 11, wherein the pre-driving circuit is configured to enable, when the clock signal is enabled and logic levels are different between the input signal and the delayed output signal, the first pre-driving signal and the second pre-driving signal according to the logic level of the input signal.

13. The signal driver circuit of claim 11, wherein the output control circuit is configured to receive the first pre-driving signal and the second pre-driving signal and configured to generate, based on the first pre-driving signal and the second pre-driving signal, the delayed output signal and the complementary delayed output signal from the output signal.

14. The signal driver circuit of claim 11,
wherein the output control circuit is configured to receive the first pre-driving signal and the second pre-driving signal, and
wherein the output control circuit includes:
   a cross-coupled inverter configured to latch the output signal; and
   a delay circuit configured to sequentially delay, when the first pre-driving signal and the second pre-driving signal are disabled, an output signal of the cross-coupled inverter to generate the delayed output signal and the complementary delayed output signal.

15. The signal driver circuit of claim 11, further comprising:
   a first latch configured to maintain a voltage level of the pull-up driving signal; and
   a second latch configured to maintain a voltage level of the pull-down driving signal.

16. The signal driver circuit of claim 11, further comprising:
   a precharging circuit configured to precharge the pull-up driving signal based on the first pre-driving signal and the pull-down driving signal; and
   a discharging circuit configured to discharge the pull-down driving signal based on the second pre-driving signal and the pull-up driving signal.

17. A semiconductor apparatus comprising:
a first internal circuit including a transmitting circuit configured to generate an output signal based on an input signal and configured to transmit the output signal through a signal transmission line to a second internal circuit; and
the second internal circuit configured to receive the output signal,
wherein the transmitting circuit includes:
   a pre-driving circuit configured to generate a first pre-driving signal and a second pre-driving signal based on the input signal and a clock signal;
   a driving signal generating circuit configured to generate a pull-up driving signal based on the first pre-driving signal and a complementary delayed output signal and configured to generate a pull-down driving signal based on the second pre-driving signal and the complementary delayed output signal;
   a main driving circuit configured to generate the output signal based on the pull-up driving signal and the pull-down driving signal; and
   an output control circuit configured to latch the output signal and configured to delay the output signal to generate a delayed output signal and the complementary delayed output signal.

18. The semiconductor apparatus of claim 17,
wherein the semiconductor apparatus includes a first semiconductor chip and a second semiconductor chip,
wherein the first internal circuit is disposed in the first semiconductor chip, and the second internal circuit is disposed in the second semiconductor chip, and
wherein the signal transmission line is a Through Silicon Via.

19. The semiconductor apparatus of claim 17, wherein the pre-driving circuit is configured to generate the first pre-driving signal and the second pre-driving signal based on the input signal, the clock signal, and the delayed output signal.

20. The semiconductor apparatus of claim 19,
wherein the semiconductor apparatus includes a first semiconductor chip and a second semiconductor chip,
wherein the first internal circuit is disposed in the first semiconductor chip and the second internal circuit is disposed in the second semiconductor chip, and
wherein the signal transmission line is a Through Silicon Via.

* * * * *